United States Patent
Do et al.

(10) Patent No.: US 8,957,509 B2
(45) Date of Patent: Feb. 17, 2015

(54) INTEGRATED CIRCUIT PACKAGING SYSTEM WITH THERMAL EMISSION AND METHOD OF MANUFACTURE THEREOF

(75) Inventors: Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 292 days.

(21) Appl. No.: 13/166,809

(22) Filed: Jun. 23, 2011

(65) Prior Publication Data

US 2012/0326284 A1  Dec. 27, 2012

(51) Int. Cl.
| | |
|---|---|
| H01L 23/495 | (2006.01) |
| H01L 23/48 | (2006.01) |
| H01L 23/50 | (2006.01) |
| H01L 21/00 | (2006.01) |
| H01L 21/48 | (2006.01) |
| H01L 25/065 | (2006.01) |
| H01L 23/31 | (2006.01) |

(52) U.S. Cl.
CPC .... *H01L 23/49582* (2013.01); *H01L 23/49575* (2013.01); *H01L 21/4832* (2013.01); *H01L 25/0657* (2013.01); *H01L 23/3107* (2013.01); H01L 2224/32245 (2013.01); H01L 2224/48247 (2013.01); H01L 2224/73265 (2013.01)
USPC ........... 257/676; 257/692; 257/737; 257/738; 438/112; 438/123; 438/124; 438/127

(58) Field of Classification Search
USPC .................. 257/676, 692, 737, 738, E23.124, 257/E21.499; 438/112, 123, 124, 127
See application file for complete search history.

(56) References Cited

U.S. PATENT DOCUMENTS

| | | | | |
|---|---|---|---|---|
| 4,784,872 A | * | 11/1988 | Moeller et al. ................. | 29/841 |
| 5,355,283 A | * | 10/1994 | Marrs et al. .................... | 361/760 |
| 5,390,082 A | * | 2/1995 | Chase et al. ................... | 361/783 |
| 5,656,550 A | * | 8/1997 | Tsuji et al. ..................... | 438/123 |
| 5,696,666 A | * | 12/1997 | Miles et al. .................... | 361/764 |
| 5,894,108 A | * | 4/1999 | Mostafazadeh et al. ....... | 174/529 |
| 5,970,320 A | * | 10/1999 | Yamasaki et al. ............. | 438/123 |
| 6,238,952 B1 | | 5/2001 | Lin | |
| 6,573,123 B2 | * | 6/2003 | Li et al. .......................... | 438/123 |
| 6,841,423 B2 | * | 1/2005 | Farnworth ..................... | 438/127 |
| 6,995,460 B1 | * | 2/2006 | McLellan et al. ............. | 257/676 |
| 7,790,500 B2 | | 9/2010 | Ramos et al. | |
| 7,834,430 B2 | | 11/2010 | Do et al. | |
| 8,216,885 B2 | * | 7/2012 | Holloway ...................... | 438/123 |
| 8,492,883 B2 | * | 7/2013 | Chien et al. ................... | 257/676 |
| 2004/0097017 A1 | * | 5/2004 | Shimanuki ..................... | 438/124 |
| 2005/0133892 A1 | * | 6/2005 | Fujimoto et al. .............. | 257/676 |
| 2007/0181983 A1 | * | 8/2007 | Takai et al. .................... | 257/666 |
| 2008/0029856 A1 | * | 2/2008 | Chou et al. .................... | 257/666 |
| 2009/0127680 A1 | * | 5/2009 | Do et al. ........................ | 257/675 |
| 2009/0127682 A1 | * | 5/2009 | Kim et al. ...................... | 257/676 |
| 2011/0068463 A1 | | 3/2011 | Camacho et al. | |

* cited by examiner

*Primary Examiner* — Charles Garber
*Assistant Examiner* — Ron Pompey
(74) *Attorney, Agent, or Firm* — Ishimaru & Associates LLP

(57) ABSTRACT

A method of manufacture of an integrated circuit packaging system includes: forming a lead array having an innermost space with an innermost lead having an inner lead profile different around an inner non-horizontal side of the innermost lead; forming a middle lead having a middle lead profile the same around a lead side of the middle lead; placing an integrated circuit in the innermost space adjacent to the innermost lead; and forming a package encapsulation over the integrated circuit, the innermost lead, and the middle lead.

7 Claims, 17 Drawing Sheets

INTEGRATED CIRCUIT PACKAGING SYSTEM WITH THERMAL EMISSION AND METHOD OF MANUFACTURE THEREOF

TECHNICAL FIELD

The present invention relates generally to an integrated circuit packaging system and more particularly to a system for an integrated circuit packaging system with encapsulation.

BACKGROUND ART

The rapidly growing market for portable electronics devices, e.g. cellular phones, laptop computers, and PDAs, is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant die periphery between the current semiconductor capability and the available supporting electronic packaging technologies. The limitations and issues with current technologies include increasing clock rates, EMI radiation, thermal loads, second level assembly reliability stresses and cost.

As these packaging systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead array having an innermost space with an innermost lead having an inner lead profile different around an inner non-horizontal side of the innermost lead; forming a middle lead having a middle lead profile the same around a lead side of the middle lead; placing an integrated circuit in the innermost space adjacent to the innermost lead; and forming a package encapsulation over the integrated circuit, the innermost lead, and the middle lead.

The present invention provides an integrated circuit system, including: a lead array having an innermost space with an innermost lead having an inner lead profile different around an inner non-horizontal side of the innermost lead; a middle lead having a middle lead profile the same around a lead side of the middle lead; an integrated circuit in the innermost space adjacent to the innermost lead; and a package encapsulation over the integrated circuit, the innermost lead, and the middle lead.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
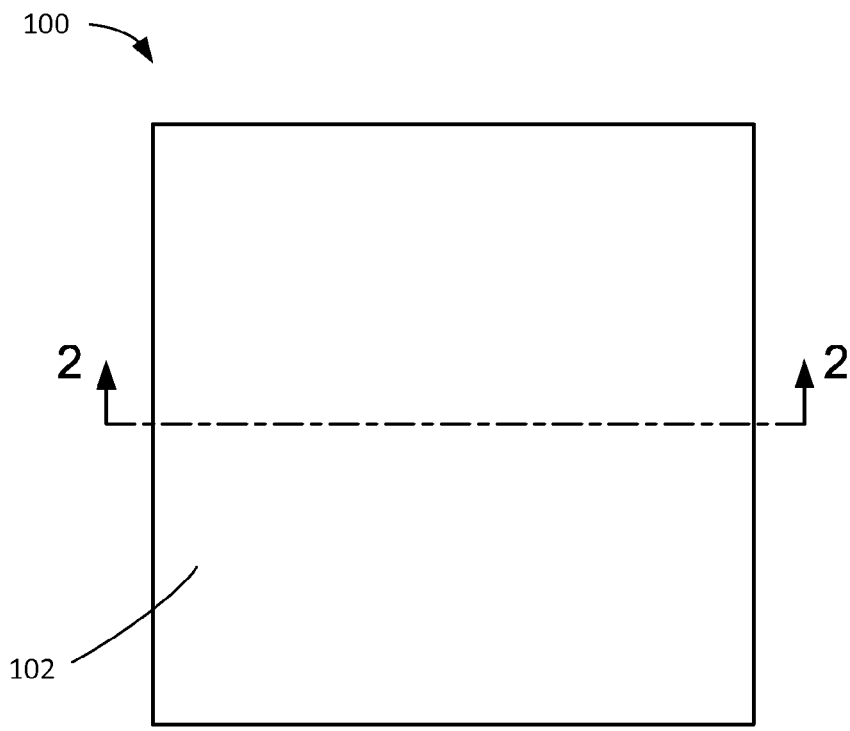
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include a package encapsulation 102. The package encapsulation 102 is defined as a cover surrounding and protecting the contents in the integrated circuit packaging system 100 from the environment. The package encapsulation 102 can be an epoxy molding, other protective molding, or other encasement structure.

Figure 2:
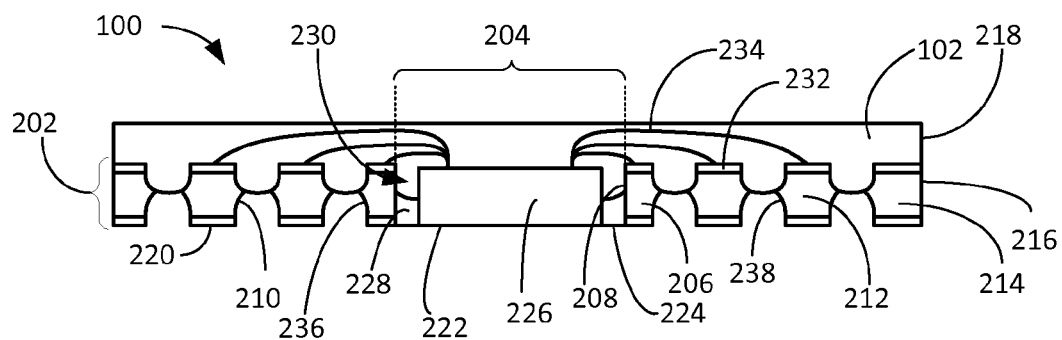
FIG. 2 is a cross-sectional view of the integrated circuit packaging system along the line 2-2 of FIG. 1.

Referring now to FIG. 2, therein is shown a cross-sectional view of the integrated circuit packaging system 100 along the line 2-2 of FIG. 1. The integrated circuit packaging system 100 can include a lead array 202 having an innermost space 204 with innermost leads 206 having an inner lead profile 236 different around an inner non-horizontal side 208 of the innermost leads 206.

A lead in the lead array 202 is defined as a conductive structure that provides connectivity for an electrical signal or an electrical potential level between the integrated circuit packaging system 100 and an external system (not shown). For example, the lead array 202 can include the innermost leads 206, middle leads 212, and peripheral leads 214.

The lead array 202 can include the innermost space 204, which is defined as an opening in the lead array 202 most central to the integrated circuit packaging system 100. For example, the innermost space 204 can locate in the center of the lead array 202. For another example, the innermost space 204 can locate between the innermost leads 206.

The innermost leads 206 are defined as the leads of the lead array 202 that are the most central to the integrated circuit packaging system 100. For example, the innermost leads 206 can be the leads having a different shape than the middle leads 212 and the peripheral leads 214. For a different example, the innermost leads 206 can be located adjacent to the innermost space 204. For another example, the innermost leads 206 can be reduced in size compared to the middle leads 212 and peripheral leads 214 by a process of sawing, shearing, laser trimming, or the like.

The innermost leads 206 can include the inner non-horizontal side 208, which is defined as a side surface of the innermost leads 206. For example, the inner non-horizontal side 208 can be adjacent to and facing the innermost space 204. For this example, the inner non-horizontal side 208 can represent a vertical side.

The innermost leads 206 can have the inner lead profile 236, which is defined as the contour representing a non-horizontal surface of the innermost leads 206. For example, the inner lead profile 236 of the innermost leads 206 facing the innermost space 204 can have the inner non-horizontal side 208 that is vertical. In contrast, the inner lead profile 236 of the innermost leads 206 facing away from the innermost space 204 can have the inner non-horizontal side 208 that is concaved with an outthrust.

The middle leads 212 are defined as the leads of the lead array 202 that electrically connects the internal and external portion of the integrated circuit package system 100. The middle leads 212 are adjacent to the innermost lead 206. For example, the middle leads 212 can be the leads in the lead array 202 between the innermost lead 206 and the peripheral lead 214. For different example, the middle leads 212 can be the leads having a different shape than the innermost leads 206 and the peripheral leads 214. For another example, one of the middle leads 212 can locate between the innermost leads 206 and another of the middle leads 212. For different example, one of the middle leads 212 can locate between two of another of the middle leads 212. For another example, one of the middle leads 212 can locate between another of the middle leads 212 and the peripheral leads 214.

The middle leads 212 can include a lead side 210, which is defined as a side surface of the middle leads 212. For this example, the lead side 210 and the inner non-horizontal side 208 can have different contours, because the inner non-horizontal side 208 can have a geometric configuration of a vertical planar side on one side while the lead side 210 can have a geometric configuration of an outthrust on all sides.

The middle leads 212 can have a middle lead profile 238, which is defined as the contour representing a non-horizontal surface of the middle leads 212. For example, the middle leads 212 can have the middle lead profile 238 with the lead side 210 having the same contour all around the middle leads 212.

The peripheral leads 214 are defined as the leads having a planar side exposed and facing away from the middle leads 212 and the innermost leads 206. For example, the peripheral leads 214 can be the leads having a different shape than the innermost leads 206 and the middle leads 212. For another example, the peripheral leads 214 can locate at the peripheral edges of the integrated circuit packaging system 100 having an outer vertical planar side 216 exposed. An outer vertical side 216 is defined as a side surface of the peripheral leads 214 facing away from the innermost space 204. For example, the outer vertical side 216 can be coplanar with an encapsulation vertical side 218.

The package encapsulation 102 can include the encapsulation vertical side 218, which is defined as a side surface of the package encapsulation 102 facing away from the innermost space 204. For example, the encapsulation vertical side 218 can be coplanar with the outer vertical side 216 of the peripheral leads 214.

The integrated circuit packaging system 100 can include an integrated circuit 226 placed in the innermost space 204. The integrated circuit 226 is defined as chip with active circuitry fabricated thereon. For example, the integrated circuit 226 can include a flip chip, a wire bonded chip, or a packaged integrated circuit. For another example, the integrated circuit packaging system 100 can include the integrated circuit 226 placed in the innermost space 204 evenly spaced from the innermost leads 206. For a different example, the integrated circuit 226 can be placed in the innermost space 204 adjacent to the innermost leads 206.

The integrated circuit 226 can include a die bottom side 222, which is defined as the non-active side of the integrated circuit 226. For example, the die bottom side 222 can be coplanar with a lead bottom side 220.

The innermost leads 206, the middle leads 212, and the peripheral leads 214 can include the lead bottom side 220. For example, the lead bottom side 220 can be coplanar with the die bottom side 222.

The integrated circuit packaging system 100 can include a sealing filler 228 for sealing a sealing space 230 directly and only between the innermost leads 206 and the integrated circuit 226 with the integrated circuit 226 and the sealing filler 228 partially exposed from the package encapsulation 102. The innermost leads 206 are between the sealing filler 228 and the middle leads 212. The sealing filler 228 is defined as a molding compound for sealing the sealing space 230. For example, the sealing filler 228 can include an epoxy molding compound and a polycarbonate compound. For another example, the sealing filler 228 can be deposited in the sealing space 230 between the innermost leads 206 and the integrated circuit 226. The package encapsulation 102 is partially in the sealing space 230 and directly on the sealing filler 228 in the sealing space 230.

The sealing filler 228 can include a filler bottom side 224. For example, the lead bottom side 220 of the lead array 202 can be formed to be coplanar with the die bottom side 222 of the integrated circuit 226 and the filler bottom side 224 of the sealing filler 228 with the lead bottom side 220, the die bottom side 222 and the filler bottom side 224 exposed.

It has been discovered that having the die bottom side 222 coplanar with the lead bottom side 220 and the filler bottom side 224 for exposing the die bottom side 222 improves the thermal performance of the integrated circuit 226. Improving the thermal performance of the integrated circuit 226 increases board level reliability and performance of the semiconductor device. The high thermal device package of the present invention can be applied to various semiconductor devices, thus, lowering the production cost.

The sealing space 230 is defined as the opening between the innermost leads 206 and the integrated circuit 226. For example, the sealing filler 228 can be applied in the sealing space 230 to prevent bleeding of the epoxy molding compound for forming the package encapsulation 102.

It has been discovered that the application of the sealing filler 228 can prevent the potential mold bleeding problem from forming the package encapsulation 102. Furthermore, the inner lead profile 236 having the inner non-horizontal side 208 different around the innermost leads 206 improves the application of the sealing filler 228 in the sealing space 230, thus, improving the prevention of the mold bleeding problem. The prevention reduces the number of defective high thermal device package, thus, lowering the production cost.

The innermost leads 206, the middle leads 212, and the peripheral leads 214 can include a lead conductive top 232, which is defined as a conductive cover at a top portion of the lead and provides electrical connectivity between a semiconductor device and the lead. For example, an electrical interconnect 234 is connected to the integrated circuit 226 and the lead conductive top 232 of one of the middle leads 212. Also for example. the integrated circuit 226 and the lead array 202 can be coupled with another of an electrical interconnect 234 connecting the integrated circuit 226 and the lead conductive top 232 of one of the innermost leads 206. The package capsulation 102 is directly on the electrical interconnect 234.

The electrical interconnect 234 is defined as a connection interface for electrical connection to other components. For example, the electrical interconnect 234 can include a bondwire, solder columns, solder balls, conductive interconnects, or lateral interconnects. For this example, the electrical interconnect 234 can represent a bondwire connecting the integrated circuit 226 and the lead conductive top 232.

Figure 3:
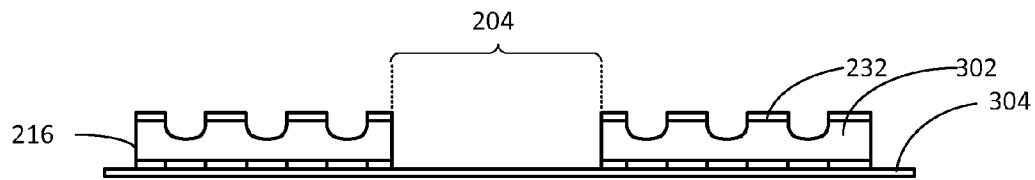
FIG. 3 is a cross-sectional view of a leadframe mounted over a tape for manufacture of the integrated circuit packaging system of FIG. 1 after a mounting phase of manufacture.

Referring now to FIG. 3, therein is shown a cross-sectional view of a leadframe 302 mounted over a tape 304 for manufacture of the integrated circuit packaging system 100 of FIG. 1 after a mounting phase of manufacture. For example, the tape 304 can include a base film as the bottom layer and an ultraviolet B-stage film adhesive layer as the top layer.

The leadframe 302 is defined as an electrically conductive structure that provides manufacturing support and is incorporated into the integrated circuit packaging system 100. The leadframe 302 can be a metallic composition including copper, tin, zinc, or other conductive metal or alloys. For example, the leadframe 302 can include the lead conductive top 232 and the outer vertical side 216. For another example, the leadframe 302 can include the innermost space 204 with the tape 304 as the bottom of the innermost space 204.

Figure 4:
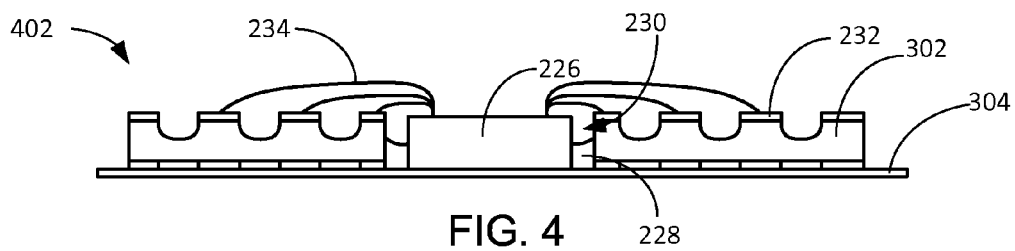
FIG. 4 is a cross-sectional view of a structure for manufacture of the integrated circuit packaging system of FIG. 1 after placing the integrated circuit in the innermost space.

Referring now to FIG. 4, therein is shown a cross-sectional view of a structure 402 for manufacture of the integrated circuit packaging system 100 of FIG. 1 after placing the integrated circuit 226 in the innermost space 204 of FIG. 3. The structure 402 can include the integrated circuit 226 placed in the innermost space 204 of the leadframe 302 over the tape 304. Furthermore, the sealing filler 228 can be deposited in the sealing space 230. The integrated circuit 226 can be coupled to the leadframe 302 by connecting the integrated circuit 226 and the lead conductive top 232 with the electrical interconnect 234.

Figure 5:
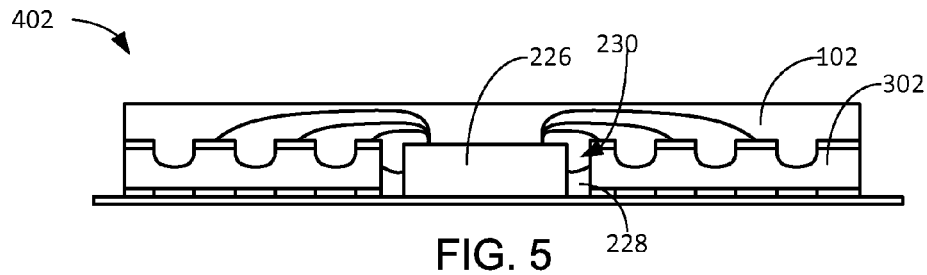
FIG. 5 is a cross-sectional view of the structure of FIG. 4 after a mold phase of manufacture.

Referring now to FIG. 5, therein is shown a cross-sectional view of the structure 402 of FIG. 4 after a mold phase of manufacture. The structure 402 can include the package encapsulation 102 formed over the integrated circuit 226, the sealing space 230, the sealing filler 228, and the leadframe 302.

Figure 6:
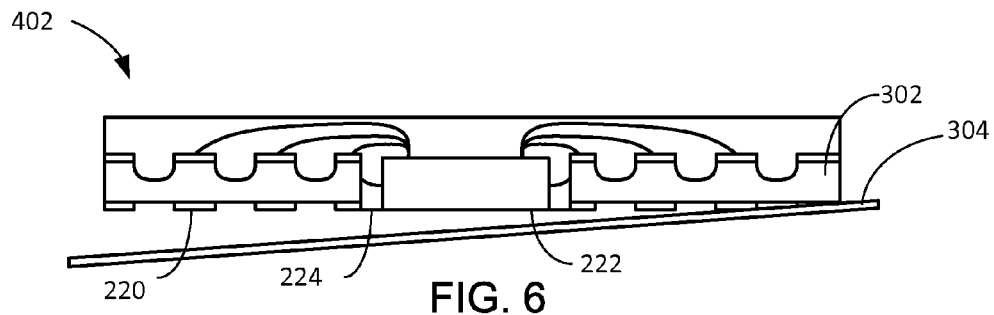
FIG. 6 is a cross-sectional view of the structure of FIG. 5 after removal phase of manufacture.

Referring now to FIG. 6, therein is shown a cross-sectional view of the structure 402 of FIG. 5 after removal phase of manufacture. The tape 304 can be removed from the structure 402 for exposing the lead bottom side 220 of the leadframe 302, the filler bottom side 224, and the die bottom side 222.

Figure 7:
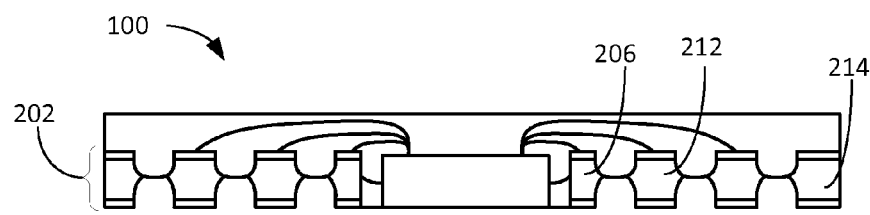
FIG. 7 is a cross-sectional view of the integrated circuit packaging system of FIG. 2 after an etch phase of manufacture.

Referring now to FIG. 7, therein is shown a cross-sectional view of the integrated circuit packaging system 100 of FIG. 2 after an etch phase of manufacture. The integrated circuit packaging system 100 can include the lead array 202 having the innermost leads 206, the middle leads 212, and the peripheral leads 214 after etching the leadframe 302 of FIG. 6. The sealing filler 228 of FIG. 4 is applied before completely forming the innermost leads 206 and the middle leads 212.

Figure 8:
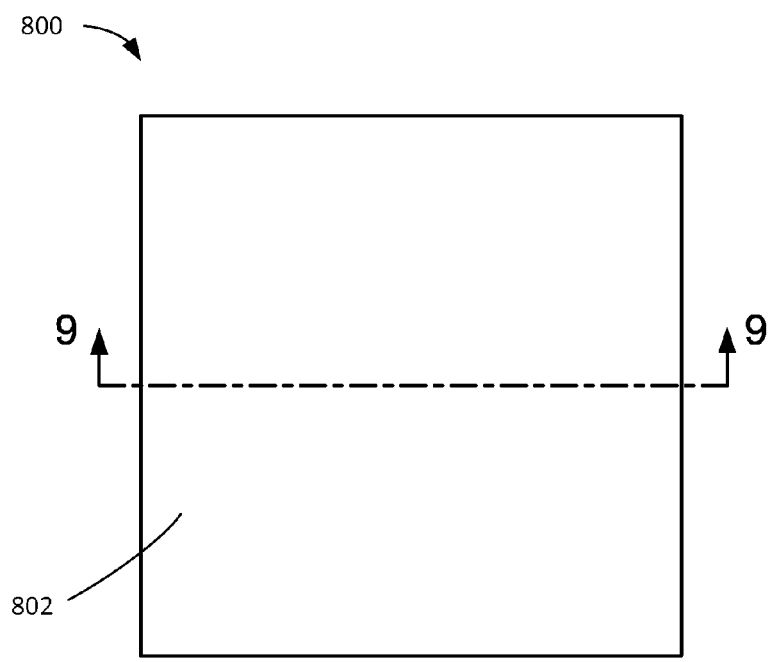
FIG. 8 is a top view of an integrated circuit packaging system in a second embodiment of the present invention.

Referring now to FIG. 8, therein is shown a top view of an integrated circuit packaging system 800 in a second embodiment of the present invention. The integrated circuit packaging system 800 can include a package encapsulation 802. The package encapsulation 802 is defined as a cover surrounding and protecting the contents in the integrated circuit packaging system 800 from the environment. The package encapsulation 802 can be an epoxy molding, other protective molding, or other encasement structure.

Figure 9:
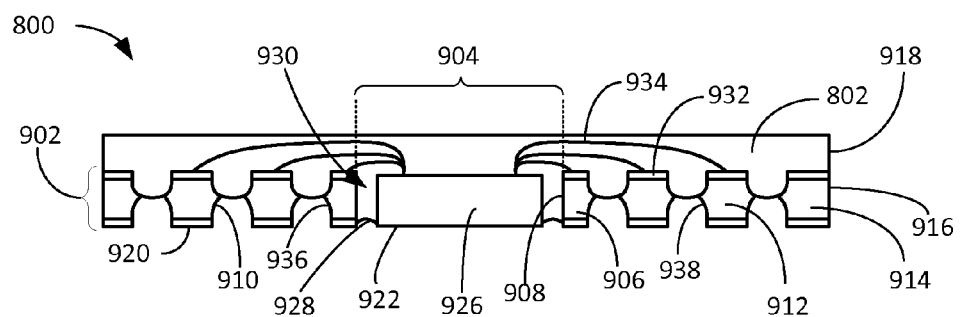
FIG. 9 is a cross-sectional view of the integrated circuit packaging system along the line 9-9 of FIG. 8.

Referring now to FIG. 9, therein is shown a cross-sectional view of the integrated circuit packaging system 800 along the line 9-9 of FIG. 8. The integrated circuit packaging system 800 can include a lead array 902 having an innermost space 904 with innermost leads 906 having an inner lead profile 936 different around an inner non-horizontal side 908 of the innermost leads 906.

A lead in the lead array 902 is defined as a conductive structure that provides connectivity for an electrical signal or an electrical potential level between the integrated circuit packaging system 800 and an external system (not shown). For example, the lead array 902 can include the innermost leads 906, middle leads 912, and peripheral leads 914.

The lead array 902 can include the innermost space 904, which is defined as an opening in the lead array 902 most central to the integrated circuit packaging system 800. For example, the innermost space 904 can locate in the center of the lead array 902. For another example, the innermost space 904 can locate between the innermost leads 906.

The innermost leads 906 are defined as the leads of the lead array 902 that are the most central to the integrated circuit packaging system 800. For example, the innermost leads 906 can be the leads having a different shape than the middle leads 912 and the peripheral leads 914. For a different example, the innermost leads 906 can be located adjacent to the innermost space 904. For another example, the innermost leads 906 can be reduced in size compared to the middle leads 912 and peripheral leads 914 by a process of sawing, shearing, laser trimming, or the like.

The innermost leads 906 can include the inner non-horizontal side 908, which is defined as a side surface of the innermost leads 906. For example, the inner non-horizontal side 908 can be adjacent to and facing the innermost space 904. For this example, the inner non-horizontal side 908 can represent a vertical side.

The innermost leads 906 can have the inner lead profile 936, which is defined as the contour representing a non-horizontal surface of the innermost leads 906. For example, the inner lead profile 936 of the innermost leads 906 facing the innermost space 904 can have the inner non-horizontal side 908 that is vertical. In contrast, the inner lead profile 936 of the innermost leads 906 facing away from the innermost space 904 can have the inner non-horizontal side 908 that is concaved with an outthrust.

The middle leads 912 are defined as the leads of the lead array 902 that electrically connects the internal and external portion of the integrated circuit package system 800. For example, the middle leads 912 can be the leads in the lead array 902 between the innermost lead 906 and the peripheral lead 914. For different example, the middle leads 912 can be the leads having a different shape than the innermost leads 906 and the peripheral leads 914. For another example, one of the middle leads 912 can locate between the innermost leads 906 and another of the middle leads 912. For different example, one of the middle leads 912 can locate between two of another of the middle leads 912. For another example, one of the middle leads 912 can locate between another of the middle leads 912 and the peripheral leads 914.

The middle leads 912 can include a lead side 910, which is defined as a side surface of the middle leads 912. For this example, the lead side 910 and the inner non-horizontal side 908 can have different contours, because the inner non-horizontal side 908 can have a geometric configuration of a vertical planar side on one side while the lead side 910 can have a geometric configuration of an outthrust on all sides.

The middle leads 912 can have a middle lead profile 938, which is defined as the contour representing a non-horizontal surface of the middle leads 912. For example, the middle leads 912 can have the middle lead profile 938 with the lead side 910 having the same contour all around the middle leads 912.

The peripheral leads 914 are defined as the leads having a planar side exposed and facing away from the middle leads 912 and the innermost leads 906. For example, the peripheral leads 914 can be the leads having a different shape than the innermost leads 906 and the middle leads 912. For another example, the peripheral leads 914 can locate at the peripheral edges of the integrated circuit packaging system 800 having an outer vertical planar side 916 exposed. An outer vertical side 916 is defined as a side surface of the peripheral leads 914 facing away from the innermost space 904. For example, the outer vertical side 916 can be coplanar with an encapsulation vertical side 918.

The package encapsulation 802 can include the encapsulation vertical side 918, which is defined as a side surface of the package encapsulation 802 facing away from the innermost space 904. For example, the encapsulation vertical side 918 can be coplanar with the outer vertical side 916 of the peripheral leads 914.

The integrated circuit packaging system 800 can include an integrated circuit 926 placed in the innermost space 904. The integrated circuit 926 is defined as chip with active circuitry fabricated thereon. For example, the integrated circuit 926 can include a flip chip, a wire bonded chip, or a packaged integrated circuit. For another example, the integrated circuit packaging system 800 can include the integrated circuit 926 placed in the innermost space 904 evenly spaced from the innermost leads 906. For a different example, the integrated circuit 926 can be placed in the innermost space 904 adjacent to the innermost leads 906.

The integrated circuit 926 can include a die bottom side 922, which is defined as the non-active side of the integrated circuit 926. For example, the die bottom side 922 can be coplanar with a lead bottom side 920.

The innermost leads 906, the middle leads 912, and the peripheral leads 914 can include the lead bottom side 920. For example, the lead bottom side 920 can be coplanar with the die bottom side 922.

It has been discovered that having the die bottom side 922 coplanar with the lead bottom side 920 for exposing the die bottom side 922 improves the thermal performance of the integrated circuit 926. Improving the thermal performance of the integrated circuit 926 increases board level reliability and performance of the semiconductor device. The high thermal device package of the present invention can be applied to various semiconductor devices, thus, lowering the production cost.

A sealing space 930 is defined as the opening between the innermost leads 906 and the integrated circuit 926. For example, the package encapsulation 802 can fill in the sealing space 930.

The innermost leads 906, the middle leads 912, and the peripheral leads 914 can include a lead conductive top 932, which is defined as a conductive cover at a top portion of the lead and provides electrical connectivity between a semiconductor device and the lead. For example, the integrated circuit and the lead array 902 can be coupled with an electrical interconnect 934 connecting the integrated circuit 926 and the lead conductive top 932.

The electrical interconnect 934 is defined as a connection interface for electrical connection to other components. For example, the electrical interconnect 934 can include a bondwire, solder columns, solder balls, conductive interconnects, or lateral interconnects. For this example, the electrical interconnect 934 can represent a bondwire connecting the integrated circuit 926 and the lead conductive top 932.

The package encapsulation 802 can include a mold cap bottom side 928, which is defined as the bottom side of the package encapsulation 802 for filling the sealing space 930. For example, the package encapsulation 802 can be formed by filling the sealing space 930 between the innermost leads 906 and the integrated circuit 926 with the mold cap bottom side 928 of the package encapsulation 802 in the sealing space 930 concaved.

Figure 10:
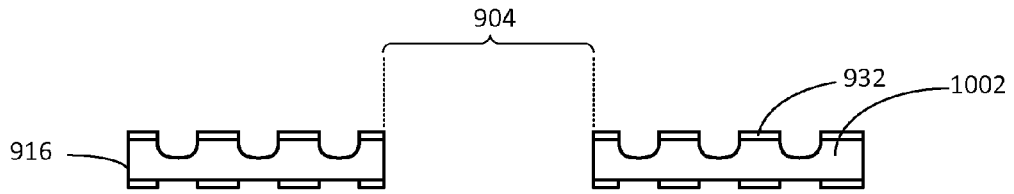
FIG. 10 is a cross-sectional view of a leadframe for manufacture of the integrated circuit packaging system of FIG. 8 after a providing phase of manufacture.

Referring now to FIG. 10, therein is shown a cross-sectional view of a leadframe 1002 for manufacture of the integrated circuit packaging system 800 of FIG. 8 after a providing phase of manufacture. The leadframe 1002 is defined as an electrically conductive structure that provides manufacturing support and is incorporated into the integrated circuit packaging system 800. The leadframe 1002 can be a metallic composition including copper, tin, zinc, or other conductive metal or alloys. For example, the leadframe 1002 can include the lead conductive top 932 and the outer vertical side 916. For another example, the leadframe 1002 can include the innermost space 904 in the center of the leadframe 1002.

Figure 11:
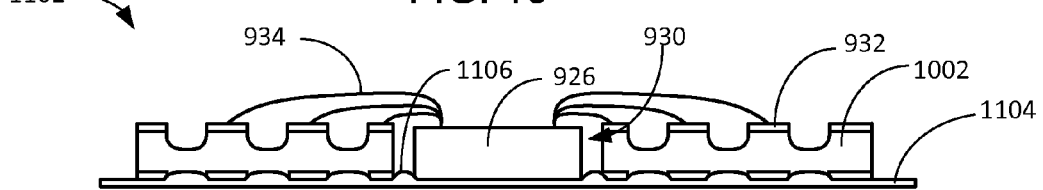
FIG. 11 is a cross-sectional view of a structure for manufacture of the integrated circuit packaging system of FIG. 8 after placing the integrated circuit in the innermost space and over a tape.

Referring now to FIG. 11, therein is shown a cross-sectional view of a structure 1102 for manufacture of the integrated circuit packaging system 800 of FIG. 8 after placing the integrated circuit 926 in the innermost space 904 of FIG. 10 and over a tape 1104. For example, the tape 1104 can include a base film as the bottom layer and an ultraviolet B-stage film adhesive layer as the top layer.

For another example, the tape 1104 can include a protrusion 1106, which is defined as the tape 1104 having a convex shape surface for filling the sealing space 930. The integrated circuit 926 can be coupled to the leadframe 1002 by connecting the integrated circuit 926 and the lead conductive top 932 with the electrical interconnect 934.

It has been discovered that the application of the tape 1104 having the protrusion 1106 can anticipate and prevent the potential mold bleeding problem from forming the package encapsulation 802 of FIG. 9. The anticipation and prevention reduces the number of defective high thermal device package, thus, lowering the production cost.

Figure 12:
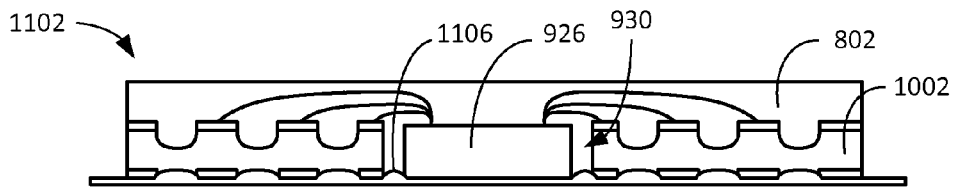
FIG. 12 is a cross-sectional view of the structure of FIG. 11 after a mold phase of manufacture.

Referring now to FIG. 12, therein is shown a cross-sectional view of the structure 1102 of FIG. 11 after a mold phase of manufacture. The structure 1102 can include the package encapsulation 802 formed over the integrated circuit 926, the sealing space 930, the protrusion 1106, and the leadframe 1002.

Figure 13:
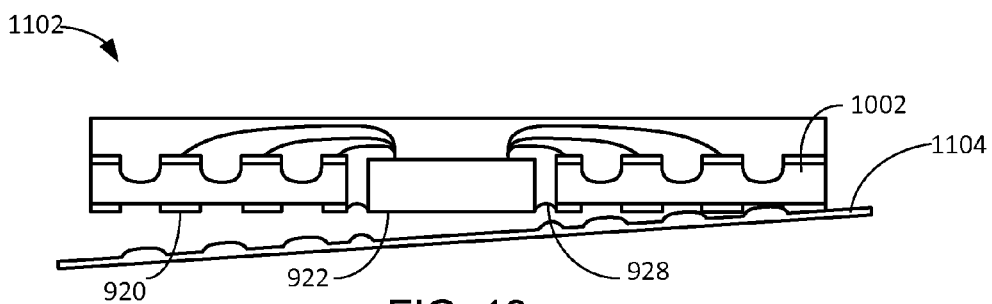
FIG. 13 is a cross-sectional view of the structure of FIG. 11 after removal phase of manufacture.

Referring now to FIG. 13, therein is shown a cross-sectional view of the structure 1102 of FIG. 11 after removal phase of manufacture. The tape 1104 can be removed from the structure 1102 for exposing the lead bottom side 920 of the leadframe 1002, the mold cap bottom side 928, and the die bottom side 922.

Figure 14:
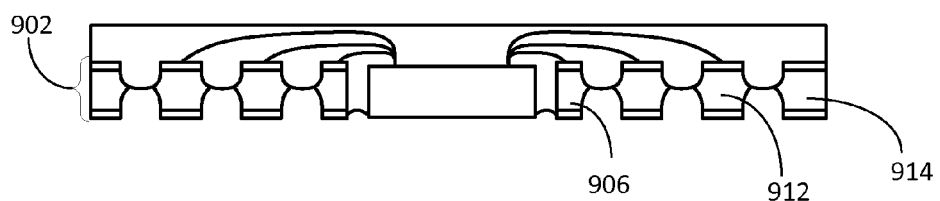
FIG. 14 is a cross-sectional view of the integrated circuit packaging system of FIG. 9 after an etch phase of manufacture.

Referring now to FIG. 14, therein is shown a cross-sectional view of the integrated circuit packaging system 800 of FIG. 9 after an etch phase of manufacture. The integrated circuit packaging system 800 can include the lead array 902 having the innermost leads 906, the middle leads 912, and the peripheral leads 914 after etching the leadframe 1002 of FIG. 13.

Figure 15:
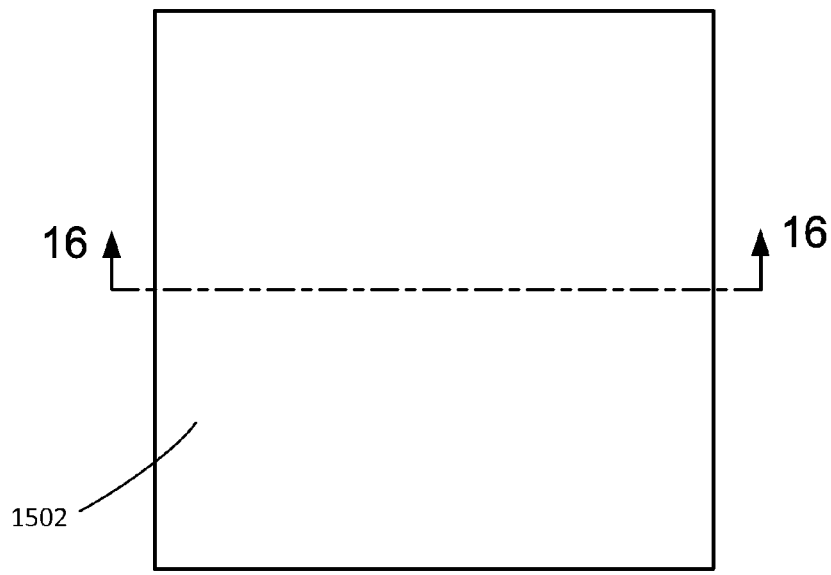
FIG. 15 is a top view of an integrated circuit packaging system in a third embodiment of the present invention.

Referring now to FIG. 15, therein is shown a top view of an integrated circuit packaging system 1500 in a third embodiment of the present invention. The integrated circuit packaging system 1500 can include a package encapsulation 1502. The package encapsulation 1502 is defined as a cover surrounding and protecting the contents in the integrated circuit packaging system 1500 from the environment. The package encapsulation 1502 can be an epoxy molding, other protective molding, or other encasement structure.

Figure 16:
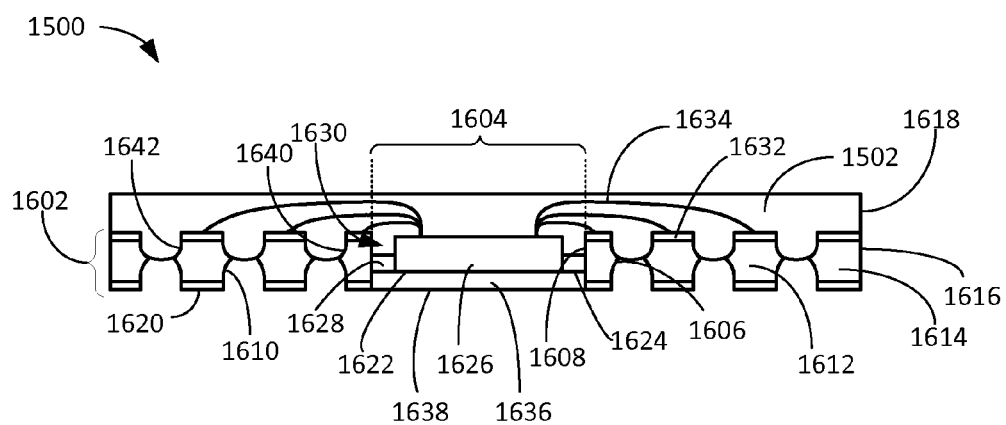
FIG. 16 is a cross-sectional view of the integrated circuit packaging system along the line 16-16 of FIG. 15.

Referring now to FIG. 16, therein is shown a cross-sectional view of the integrated circuit packaging system 1500 along the line 16-16 of FIG. 15. The integrated circuit packaging system 1500 can include a lead array 1602 having an innermost space 1604 with innermost leads 1606 having an inner lead profile 1640 different around an inner non-horizontal side 1608 of the innermost leads 1606.

A lead in the lead array 1602 is defined as a conductive structure that provides connectivity for an electrical signal or an electrical potential level between the integrated circuit packaging system 1500 and an external system (not shown). For example, the lead array 1602 can include the innermost leads 1606, middle leads 1612, and peripheral leads 1614.

The lead array 1602 can include the innermost space 1604, which is defined as an opening in the lead array 1602 most central to the integrated circuit packaging system 1500. For example, the innermost space 1604 can locate in the center of the lead array 1602. For another example, the innermost space 1604 can locate between the innermost leads 1606.

The innermost leads 1606 are defined as the leads of the lead array 1602 that are the most central to the integrated circuit packaging system 1500. For example, the innermost leads 1606 can be the leads having a different shape than the middle leads 1612 and the peripheral leads 1614. For a different example, the innermost leads 1606 can be located adjacent to the innermost space 1604. For another example, the innermost leads 1606 can be reduced in size compared to the middle leads 1612 and peripheral leads 1614 by a process of sawing, shearing, laser trimming, or the like.

The innermost leads 1606 can include the inner non-horizontal side 1608, which is defined as a side surface of the innermost leads 1606. For example, the inner non-horizontal side 1608 can be adjacent to and facing the innermost space 1604. For this example, the inner non-horizontal side 1608 can represent a vertical side.

The innermost leads 1606 can have the inner lead profile 1640, which is defined as the contour representing a non-horizontal surface of the innermost leads 1606. For example, the inner lead profile 1640 of the innermost leads 1606 facing the innermost space 1604 can have the inner non-horizontal side 1608 that is vertical. In contrast, the inner lead profile 1640 of the innermost leads 1606 facing away from the innermost space 1604 can have the inner non-horizontal side 1608 that is concaved with an outthrust.

The middle leads 1612 are defined as the leads of the lead array 1602 that electrically connects the internal and external portion of the integrated circuit package system 1500. For example, the middle leads 1612 can be the leads in the lead array 1602 between the innermost lead 1606 and the peripheral lead 1614. For different example, the middle leads 1612 can be the leads having a different shape than the innermost leads 1606 and the peripheral leads 1614. For another example, one of the middle leads 1612 can locate between the innermost leads 1606 and another of the middle leads 1612. For different example, one of the middle leads 1612 can locate between two of another of the middle leads 1612. For another example, one of the middle leads 1612 can locate between another of the middle leads 1612 and the peripheral leads 1614.

The middle leads 1612 can include a lead side 1610, which is defined as a side surface of the middle leads 1612. For this example, the lead side 1610 and the inner non-horizontal side 1608 can have different contours, because the inner non-horizontal side 1608 can have a geometric configuration of a vertical planar side on one side while the lead side 1610 can have a geometric configuration of an outthrust on all sides.

The middle leads 1612 can have a middle lead profile 1642, which is defined as the contour representing a non-horizontal surface of the middle leads 1612. For example, the middle leads 1612 can have the middle lead profile 1642 with the lead side 1610 having the same contour all around the middle leads 1612.

The peripheral leads 1614 are defined as the leads having a planar side exposed and facing away from the middle leads 1612 and the innermost leads 1606. For example, the peripheral leads 1614 can be the leads having a different shape than the innermost leads 1606 and the middle leads 1612. For another example, the peripheral leads 1614 can locate at the peripheral edges of the integrated circuit packaging system 1500 having an outer vertical planar side 1616 exposed. An outer vertical side 1616 is defined as a side surface of the peripheral leads 1614 facing away from the innermost space 1604. For example, the outer vertical side 1616 can be coplanar with an encapsulation vertical side 1618.

The package encapsulation 1502 can include the encapsulation vertical side 1618, which is defined as a side surface of the package encapsulation 1502 facing away from the innermost space 1604. For example, the encapsulation vertical side 1618 can be coplanar with the outer vertical side 1616 of the peripheral leads 1614.

The innermost leads 1606, the middle leads 1612, and the peripheral leads 1614 can include a lead bottom side 1620, which is defined as the bottom side of the leads. The integrated circuit packaging system 1500 can include a heat sink 1636, which is defined as a component or assembly that transfers heat generated within a solid material to a fluid medium, such as air or a liquid. For example, the heat sink 1636 can be placed in the innermost space 1604.

The heat sink 1636 can include a heat sink bottom side 1638. For example, the lead bottom side 1620 of the lead array 1602 can be formed coplanar with the heat sink bottom side 1638 of the heat sink 1636 with the lead bottom side 1620 and the heat sink bottom side 1638 exposed.

The integrated circuit packaging system 1500 can include an integrated circuit 1626 placed in the innermost space 1604 over the heat sink 1636. The integrated circuit 1626 is defined as chip with active circuitry fabricated thereon. For example, the integrated circuit 1626 can include a flip chip, a wire bonded chip, or a packaged integrated circuit.

For another example, the integrated circuit packaging system 1500 can include the integrated circuit 1626 placed in the innermost space 1604 evenly spaced from the innermost leads 1606. For a different example, the integrated circuit 1626 can be placed in the innermost space 1604 adjacent to the innermost leads 1606. The integrated circuit 1626 can include a die bottom side 1622.

The integrated circuit packaging system 1500 can include a sealing filler 1628 for sealing a sealing space 1630 between the innermost leads 1606 and the integrated circuit 1626 with the integrated circuit 1626 and the sealing filler 1628 exposed. The sealing filler 1628 is defined as a molding compound for sealing the sealing space 1630. For example, the sealing filler 1628 can include an epoxy molding compound and a polycarbonate compound. For another example, the sealing filler 1628 can be deposited in the sealing space 1630 between the innermost leads 1606 and the integrated circuit 1626.

The sealing filler 1628 can include a filler bottom side 1624, which is defined as the bottom side of the sealing filler 1628. For example, the filler bottom side 1624 can be coplanar with the die bottom side 1622.

The sealing space 1630 is defined as the opening between the innermost leads 1606 and the integrated circuit 1626. For example, the sealing filler 1628 can be applied in the sealing space 1630 to prevent bleeding of the epoxy molding compound from forming the package encapsulation 1502. For another example, the sealing filler 1628 can be applied over the heat sink 1636.

It has been discovered that the application of the sealing filler 1628 can prevent the potential mold bleeding problem from forming the package encapsulation 1502. Furthermore, the inner lead profile 1640 having the inner non-horizontal side 1608 different around the innermost leads 1606 improves the application of the sealing filler 1628 in the sealing space 1630, thus, improving the prevention of the mold bleeding problem. The prevention reduces the number of defective high thermal device package, thus, lowering the production cost.

The innermost leads 1606, the middle leads 1612, and the peripheral leads 1614 can include a lead conductive top 1632, which is defined as a conductive cover at a top portion of the lead and provides electrical connectivity between a semiconductor device and the lead. For example, the integrated circuit and the lead array 1602 can be coupled with an electrical interconnect 1634 connecting the integrated circuit 1626 and the lead conductive top 1632.

The electrical interconnect 1634 is defined as a connection interface for electrical connection to other components. For example, the electrical interconnect 1634 can include a bondwire, solder columns, solder balls, conductive interconnects, or lateral interconnects. For this example, the electrical interconnect 1634 can represent a bondwire connecting the integrated circuit 1626 and the lead conductive top 1632.

Figure 17:
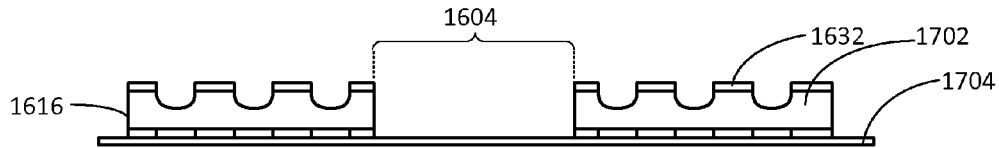
FIG. 17 is a cross-sectional view of a leadframe mounted over a tape for manufacture of the integrated circuit packaging system of FIG. 15 after a mounting phase of manufacture.

Referring now to FIG. 17, therein is shown a cross-sectional view of a leadframe 1702 mounted over a tape 1704 for manufacture of the integrated circuit packaging system 1500 of FIG. 15 after a mounting phase of manufacture. The tape 1704 is defined as a sticky material having a thermal resistant adhesive for holding components in place. For example, the tape 1704 can include a base film as the bottom layer and an ultraviolet B-stage film adhesive layer as the top layer.

The leadframe 1702 is defined as an electrically conductive structure that provides manufacturing support and is incorporated into the integrated circuit packaging system 1500. The leadframe 1702 can be a metallic composition including copper, tin, zinc, or other conductive metal or alloys. For example, the leadframe 1702 can include the lead conductive top 1632 and the outer vertical side 1616. For another example, the leadframe 1702 can include the innermost space 1604 with the tape 1704 as the bottom of the innermost space 1604.

Figure 18:
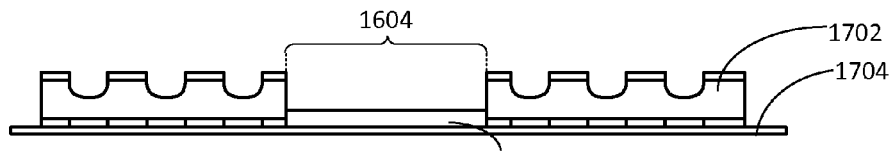
FIG. 18 is a cross-sectional view of the heat sink for manufacture of the integrated circuit packaging system of FIG. 15 after placing the heat sink in the innermost space of the leadframe.

Referring now to FIG. 18, therein is shown a cross-sectional view of the heat sink 1636 for manufacture of the integrated circuit packaging system 1500 of FIG. 15 after placing the heat sink 1636 in the innermost space 1604 of the leadframe 1702. For example, the heat sink 1636 can be mounted over the tape 1704.

Figure 19:
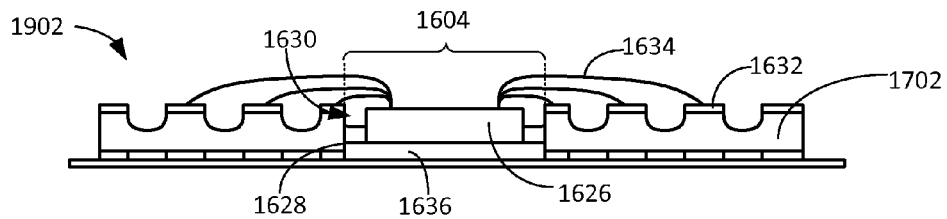
FIG. 19 is a cross-sectional view of a structure for manufacture of the integrated circuit packaging system of FIG. 15 after placing the integrated circuit in the innermost space and over the heat sink.

Referring now to FIG. 19, therein is shown a cross-sectional view of a structure 1902 for manufacture of the integrated circuit packaging system 1500 of FIG. 15 after placing the integrated circuit 1626 in the innermost space 1604 and over the heat sink 1636. The integrated circuit 1626 can be coupled to the leadframe 1702 by connecting the integrated circuit 1626 and the lead conductive top 1632 with the electrical interconnect 1634. Furthermore, the sealing filler 1628 can be deposited in the sealing space 1630.

Figure 20:
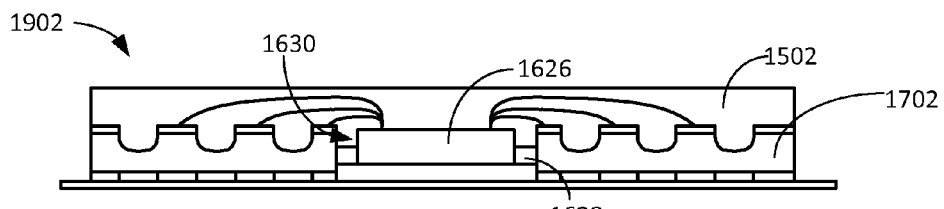
FIG. 20 is a cross-sectional view of the structure of FIG. 19 after a mold phase of manufacture.

Referring now to FIG. 20, therein is shown a cross-sectional view of the structure 1902 of FIG. 19 after a mold phase of manufacture. The structure 1902 can include the package encapsulation 1502 formed over the integrated circuit 1626, the sealing space 1630, the sealing filler 1628, and the leadframe 1702.

Figure 21:
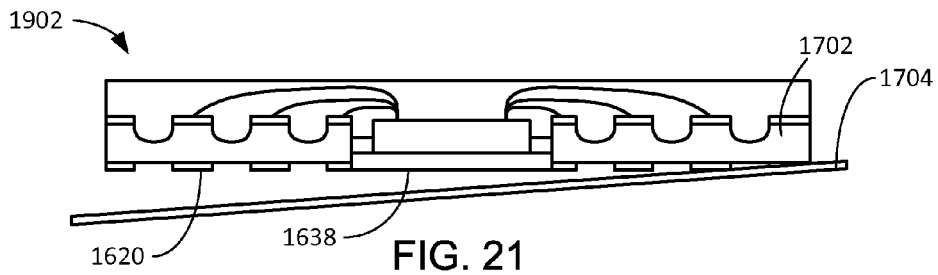
FIG. 21 is a cross-sectional view of the structure of FIG. 19 after removal phase of manufacture.

Referring now to FIG. 21, therein is shown a cross-sectional view of the structure 1902 of FIG. 19 after removal phase of manufacture. The tape 1704 can be removed from the structure 1902 for exposing the lead bottom side 1620 of the leadframe 1702 and the heat sink bottom side 1638.

Figure 22:
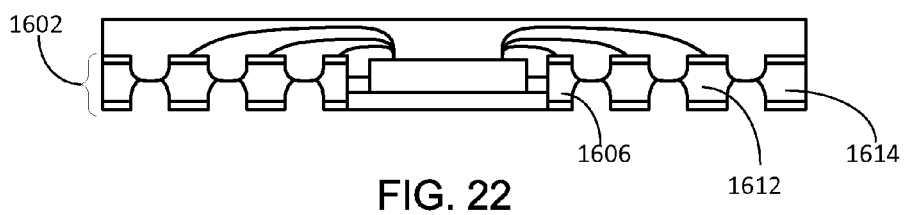
FIG. 22 is a cross-sectional view of the integrated circuit packaging system of FIG. 16 after an etch phase of manufacture.

Referring now to FIG. 22, therein is shown a cross-sectional view of the integrated circuit packaging system 1500 of FIG. 16 after an etch phase of manufacture. The integrated circuit packaging system 1500 can include the lead array 1602 having the innermost leads 1606, the middle leads 1612, and the peripheral leads 1614 after etching the leadframe 1702 of FIG. 21.

Figure 23:
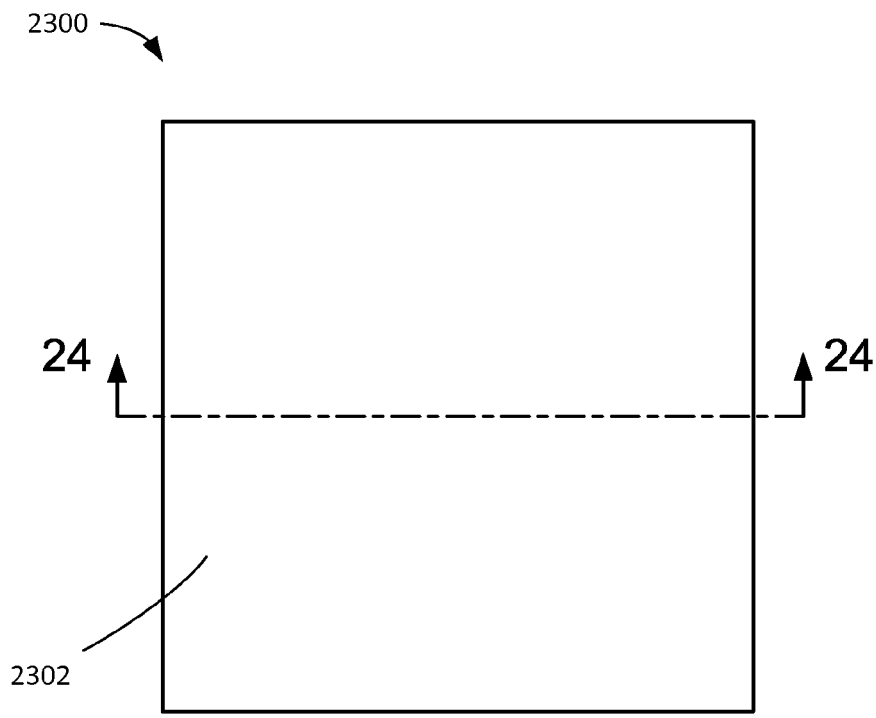
FIG. 23 is a top view of an integrated circuit packaging system in a fourth embodiment of the present invention.

Referring now to FIG. 23, therein is shown a top view of an integrated circuit packaging system 2300 in a fourth embodiment of the present invention. The integrated circuit packaging system 2300 can include a package encapsulation 2302. The package encapsulation 2302 is defined as a cover surrounding and protecting the contents in the integrated circuit packaging system 2300 from the environment. The package encapsulation 2302 can be an epoxy molding, other protective molding, or other encasement structure.

Figure 24:
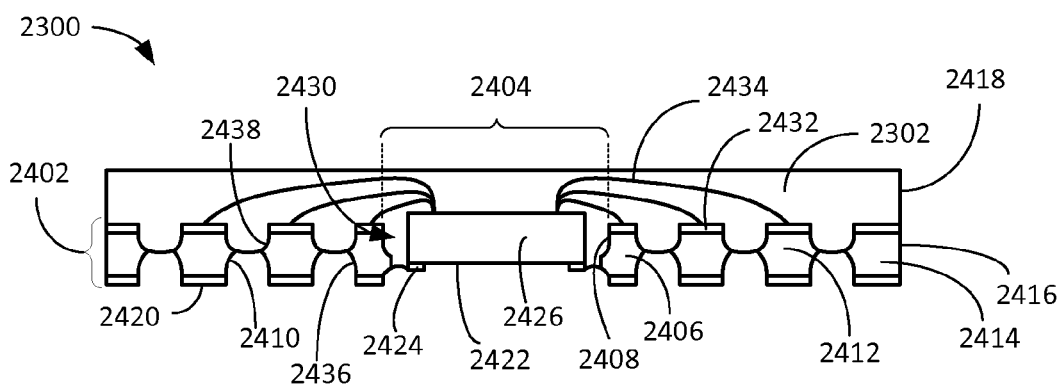
FIG. 24 is a cross-sectional view of the integrated circuit packaging system along the line 24-24 of FIG. 23.

Referring now to FIG. 24, therein is shown a cross-sectional view of the integrated circuit packaging system 2300 along the line 24-24 of FIG. 23. The integrated circuit packaging system 2300 can include a lead array 2402 having an innermost space 2404 with innermost leads 2406 having an inner lead profile 2436 different around an inner non-horizontal side 2408 of the innermost leads 2406.

A lead in the lead array 2402 is defined as a conductive structure that provides connectivity for an electrical signal or an electrical potential level between the integrated circuit packaging system 2300 and an external system (not shown). For example, the lead array 2402 can include the innermost leads 2406, middle leads 2412, and peripheral leads 2414.

The lead array 2402 can include the innermost space 2404, which is defined as an opening in the lead array 2402 most central to the integrated circuit packaging system 2300. For example, the innermost space 2404 can locate in the center of the lead array 2402. For another example, the innermost space 2404 can locate between the innermost leads 2406.

The innermost leads 2406 are defined as the leads of the lead array 2402 that are the most central to the integrated circuit packaging system 2300. For example, the innermost leads 2406 can be the leads having a different shape than the middle leads 2412 and the peripheral leads 2414. For a different example, the innermost leads 2406 can be located adjacent to the innermost space 2404. For another example, the innermost leads 2406 can be reduced in size compared to the middle leads 2412 and peripheral leads 2414 by a process of sawing, shearing, laser trimming, or the like.

The innermost leads 2406 can include the inner non-horizontal side 2408, which is defined as a side surface of the innermost leads 2406. For example, the inner non-horizontal side 2408 can be adjacent to and facing the innermost space 2404. For this example, the inner non-horizontal side 2408 can represent a vertical side.

The innermost leads 2406 can have the inner lead profile 2436, which is defined as the contour representing a non-horizontal surface of the innermost leads 2406. For example, the inner lead profile 2436 of the innermost leads 2406 facing the innermost space 2404 can have the inner non-horizontal side 2408 that is vertical. In contrast, the inner lead profile 2436 of the innermost leads 2406 facing away from the innermost space 2404 can have the inner non-horizontal side 2408 that is concaved with an outthrust.

The middle leads 2412 are defined as the leads of the lead array 2402 that electrically connects the internal and external portion of the integrated circuit package system 2300. For example, the middle leads 2412 can be the leads in the lead array 2402 between the innermost lead 2406 and the peripheral lead 2414. For different example, the middle leads 2412 can be the leads having a different shape than the innermost leads 2406 and the peripheral leads 2414. For another example, one of the middle leads 2412 can locate between the innermost leads 2406 and another of the middle leads 2412. For different example, one of the middle leads 2412 can locate between two of another of the middle leads 2412. For another example, one of the middle leads 2412 can locate between another of the middle leads 2412 and the peripheral leads 2414.

The middle leads 2412 can include a lead side 2410, which is defined as a side surface of the middle leads 2412. For this example, the lead side 2410 and the inner non-horizontal side 2408 can have different contours, because the inner non-horizontal side 2408 can have a geometric configuration of a vertical planar side on one side while the lead side 2410 can have a geometric configuration of an outthrust on all sides.

The middle leads 2412 can have a middle lead profile 2438, which is defined as the contour representing a non-horizontal surface of the middle leads 2412. For example, the middle leads 2412 can have the middle lead profile 2438 with the lead side 2410 having the same contour all around the middle leads 2412.

The peripheral leads 2414 are defined as the leads having a planar side exposed and facing away from the middle leads 2412 and the innermost leads 2406. For example, the peripheral leads 2414 can be the leads having a different shape than the innermost leads 2406 and the middle leads 2412. For another example, the peripheral leads 2414 can locate at the peripheral edges of the integrated circuit packaging system 2300 having an outer vertical planar side 2416 exposed. An outer vertical side 2416 is defined as a side surface of the peripheral leads 2414 facing away from the innermost space 2404. For example, the outer vertical side 2416 can be coplanar with an encapsulation vertical side 2418.

The package encapsulation 2302 can include the encapsulation vertical side 2418, which is defined as a side surface of the package encapsulation 2302 facing away from the innermost space 2404. For example, the encapsulation vertical side 2418 can be coplanar with the outer vertical side 2416 of the peripheral leads 2414. The innermost leads 2406, the middle leads 2412, and the peripheral leads 2414 can include a lead bottom side 2420.

The integrated circuit packaging system 2300 can include an integrated circuit 2426 placed in the innermost space 2404. The integrated circuit 2426 is defined as chip with active circuitry fabricated thereon. For example, the integrated circuit 2426 can include a flip chip, a wire bonded chip, or a packaged integrated circuit. For another example, the integrated circuit packaging system 2300 can include the integrated circuit 2426 placed in the innermost space 2404 evenly spaced from the innermost leads 2406. For a different example, the integrated circuit 2426 can be placed in the innermost space 2404 adjacent to the innermost leads 2406. The integrated circuit 2426 can include a die bottom side 2422, which is defined as the non-active side of the integrated circuit 2426.

The integrated circuit 2426 can have an adhesive 2424, which is defined as a sticky material for holding components in place. For example, the integrated circuit 2426 can have the adhesive 2424 adhered to the die bottom side 2422 of the integrated circuit 2426 with the adhesive 2424 exposed. For another example, the adhesive 2424 can include a resin, glue, paste, cement, putty, or a polyvinyl resin emulsion.

It has been discovered that having the die bottom side 2422 exposed improves the thermal performance of the integrated circuit 2426. Improving the thermal performance of the integrated circuit 2426 increases board level reliability and performance of the semiconductor device. The high thermal device package of the present invention can be applied to various semiconductor devices, thus, lowering the production cost.

A sealing space 2430 is defined as the opening between the innermost leads 2406 and the integrated circuit 2426. For example, the package encapsulation 2302 can fill in the sealing space 2430.

The innermost leads 2406, the middle leads 2412, and the peripheral leads 2414 can include a lead conductive top 2432, which is defined as a conductive cover at a top portion of the lead and provides electrical connectivity between a semiconductor device and the lead. For example, the integrated circuit and the lead array 2402 can be coupled with an electrical interconnect 2434 connecting the integrated circuit 2426 and the lead conductive top 2432.

The electrical interconnect 2434 is defined as a connection interface for electrical connection to other components. For example, the electrical interconnect 2434 can include a bondwire, solder columns, solder balls, conductive interconnects, or lateral interconnects. For this example, the electrical interconnect 2434 can represent a bondwire connecting the integrated circuit 2426 and the lead conductive top 2432.

Figure 25:
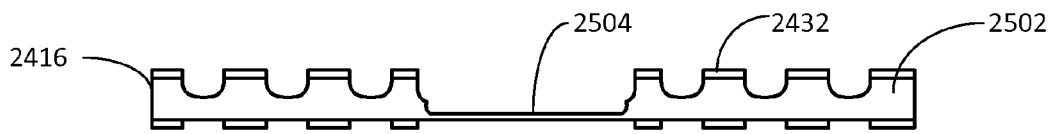
FIG. 25 is a cross-sectional view of a leadframe for manufacture of the integrated circuit packaging system of FIG. 23 after a providing phase of manufacture.

Referring now to FIG. 25, therein is shown a cross-sectional view of a leadframe 2502 for manufacture of the integrated circuit packaging system 2300 of FIG. 23 after a providing phase of manufacture. The leadframe 2502 is defined as an electrically conductive structure that provides manufacturing support and is incorporated into the integrated circuit packaging system 2300. The leadframe 2502 can be a metallic composition including copper, tin, zinc, or other conductive metal or alloys. For example, the leadframe 2502 can include the lead conductive top 2432 and the outer vertical side 2416. For another example, the leadframe 2502 can include a paddle area 2504, which is defined as a support structure for mounting or attaching a semiconductor device thereon. The paddle area 2504 can be located in the center of the leadframe 2502.

Figure 26:
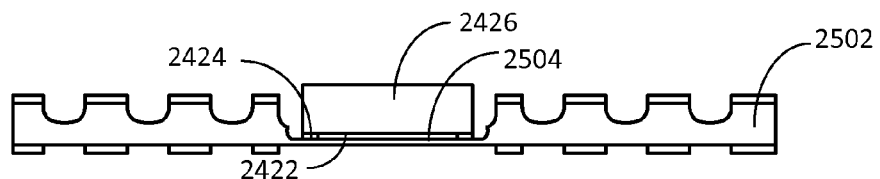
FIG. 26 is a cross-sectional view of the integrated circuit for manufacture of the integrated circuit packaging system of FIG. 23 after placing the integrated circuit having the adhesive over the paddle area of the leadframe.

Referring now to FIG. 26, therein is shown a cross-sectional view of the integrated circuit 2426 for manufacture of the integrated circuit packaging system 2300 of FIG. 23 after placing the integrated circuit 2426 having the adhesive 2424 over the paddle area 2504 of the leadframe 2502. For example, the adhesive 2424 can adhere the integrated circuit 2426 to the paddle area 2504.

The die bottom side 2422 can be coated with a layer of metallization or wetting layer for improving the adhesion to the integrated circuit 2426. For example, the layer of metallization can include nickel, platinum, palladium, cobalt, phosphorous, or a combination thereof.

Figure 27:
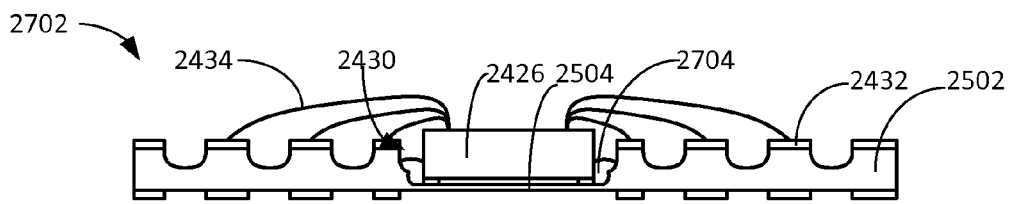
FIG. 27 is a cross-sectional view of a structure for manufacture of the integrated circuit packaging system of FIG. 23 after depositing a sealing filler in the sealing space over the paddle area.

Referring now to FIG. 27, therein is shown a cross-sectional view of a structure 2702 for manufacture of the integrated circuit packaging system 2300 of FIG. 23 after depositing a sealing filler 2704 in the sealing space 2430 over the paddle area 2504. The sealing filler 2704 is defined as a molding compound for sealing the sealing space 2430. For example, the sealing filler 2704 can include an epoxy molding compounded and a polycarbonate compound.

The structure 2702 can include the integrated circuit 2426 placed over the paddle area 2504. The integrated circuit 2426 can be coupled to the leadframe 2502 by connecting the integrated circuit 2426 and the lead conductive top 2432 with the electrical interconnect 2434.

It has been discovered that the application of the sealing filler 2704 can prevent the potential mold bleeding problem from forming the package encapsulation 2302 of FIG. 24. Furthermore, the inner lead profile 2436 of FIG. 24 having the inner non-horizontal side 2408 of FIG. 24 different around the innermost leads 2406 of FIG. 24 improves the application of the sealing filler 2704 in the sealing space 2430, thus, improving the prevention of the mold bleeding problem. The prevention reduces the number of defective high thermal device package, thus, lowering the production cost. The prevention reduces the number of defective high thermal device package, thus, lowering the production cost.

Figure 28:
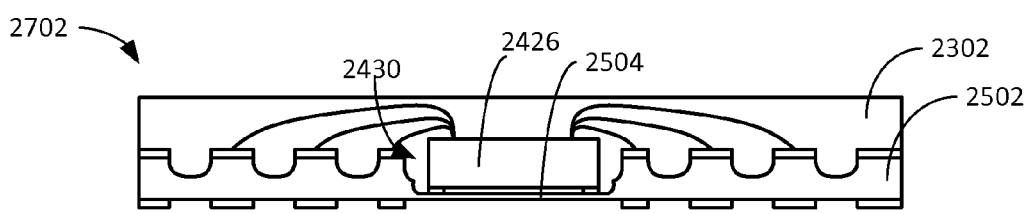
FIG. 28 is a cross-sectional view of the structure of FIG. 27 after a mold phase of manufacture.

Referring now to FIG. 28, therein is shown a cross-sectional view of the structure 2702 of FIG. 27 after a mold phase of manufacture. For example, the structure 2702 can include the package encapsulation 2302 formed over the integrated circuit 2426, the sealing space 2430, the sealing filler 2704 of FIG. 27, and the leadframe 2502. For another example, the structure 2702 can include the package encapsulation 2302 formed over the integrated circuit 2426, the sealing space 2430, the paddle area 2504, and the leadframe 2502.

Figure 29:
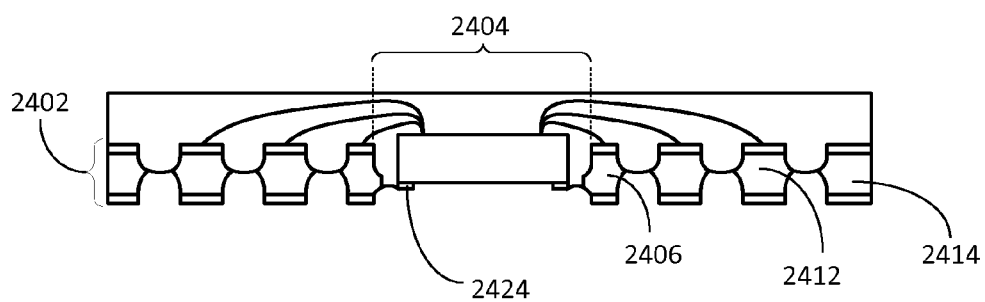
FIG. 29 is a cross-sectional view of the integrated circuit packaging system of FIG. 24 after an etch phase of manufacture.

Referring now to FIG. 29, therein is shown a cross-sectional view of the integrated circuit packaging system 2300 of FIG. 24 after an etch phase of manufacture. The integrated circuit packaging system 2300 can include the lead array 2402 having the innermost space 2404, the innermost leads 2406, the middle leads 2412, and the peripheral leads 2414 with the adhesive 2424 exposed after etching the leadframe 2502 of FIG. 28.

Figure 30:
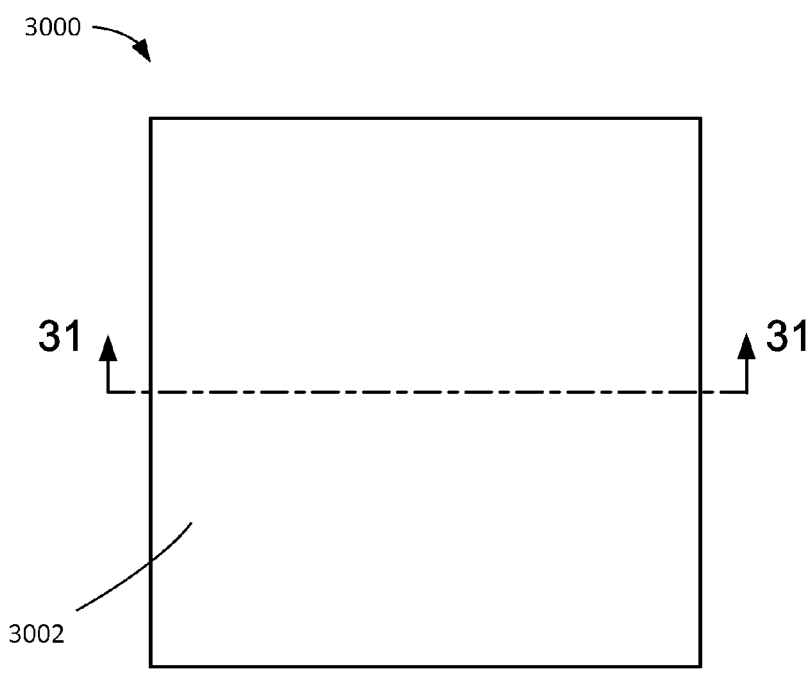
FIG. 30 is a top view of an integrated circuit packaging system in a fifth embodiment of the present invention.

Referring now to FIG. 30, therein is shown a top view of an integrated circuit packaging system 3000 in a fifth embodiment of the present invention. The integrated circuit packaging system 3000 can include a package encapsulation 3002. The package encapsulation 3002 is defined as a cover surrounding and protecting the contents in the integrated circuit packaging system 3000 from the environment. The package encapsulation 3002 can be an epoxy molding, other protective molding, or other encasement structure.

Figure 31:
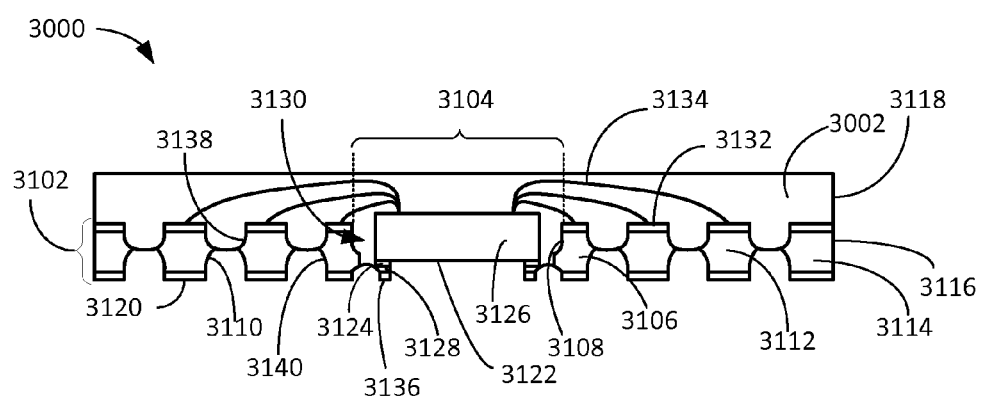
FIG. 31 is a cross-sectional view of the integrated circuit packaging system along the line 31-31 of FIG. 30.

Referring now to FIG. 31, therein is shown a cross-sectional view of the integrated circuit packaging system 3000 along the line 31-31 of FIG. 30. The integrated circuit packaging system 3000 can include a lead array 3102 having an innermost space 3104 with innermost leads 3106 having an inner lead profile 3140 different around an inner non-horizontal side 3108 of the innermost leads 3106.

A lead in the lead array 3102 is defined as a conductive structure that provides connectivity for an electrical signal or an electrical potential level between the integrated circuit packaging system 3000 and an external system (not shown). For example, the lead array 3102 can include the innermost leads 3106, middle leads 3112, and peripheral leads 3114.

The lead array 3102 can include the innermost space 3104, which is defined as an opening in the lead array 3102 most central to the integrated circuit packaging system 3000. For example, the innermost space 3104 can locate in the center of the lead array 3102. For another example, the innermost space 3104 can locate between the innermost leads 3106.

The innermost leads 3106 are defined as the leads of the lead array 3102 that are the most central to the integrated circuit packaging system 3000. For example, the innermost leads 3106 can be the leads having a different shape than the middle leads 3112 and the peripheral leads 3114. For a different example, the innermost leads 3106 can be located adjacent to the innermost space 3104. For another example, the innermost leads 3106 can be reduced in size compared to the middle leads 3112 and peripheral leads 3114 by a process of sawing, shearing, laser trimming, or the like.

The innermost leads 3106 can include the inner non-horizontal side 3108, which is defined as a side surface of the innermost leads 3106. For example, the inner non-horizontal side 3108 can be adjacent to and facing the innermost space 3104. For this example, the inner non-horizontal side 3108 can represent a vertical side.

The innermost leads 3106 can have the inner lead profile 3140, which is defined as the contour representing a non-horizontal surface of the innermost leads 3106. For example, the inner lead profile 3140 of the innermost leads 3106 facing the innermost space 3104 can have the inner non-horizontal side 3108 that is vertical. In contrast, the inner lead profile 3140 of the innermost leads 3106 facing away from the innermost space 3104 can have the inner non-horizontal side 3108 that is concaved with an outthrust.

The middle leads 3112 are defined as the leads of the lead array 3102 that electrically connects the internal and external portion of the integrated circuit package system 3000. For example, the middle leads 3112 can be the leads in the lead array 3102 between the innermost lead 3106 and the peripheral lead 3114. For different example, the middle leads 3112 can be the leads having a different shape than the innermost leads 3106 and the peripheral leads 3114. For another example, one of the middle leads 3112 can locate between the innermost leads 3106 and another of the middle leads 3112. For different example, one of the middle leads 3112 can locate between two of another of the middle leads 3112. For another example, one of the middle leads 3112 can locate between another of the middle leads 3112 and the peripheral leads 3114.

The middle leads 3112 can include a lead side 3110, which is defined as a side surface of the middle leads 3112. For this example, the lead side 3110 and the inner non-horizontal side 3108 can have different contours, because the inner non-horizontal side 3108 can have a geometric configuration of a vertical planar side on one side while the lead side 3110 can have a geometric configuration of an outthrust on all sides.

The middle leads 3112 can have a middle lead profile 3138, which is defined as the contour representing a non-horizontal surface of the middle leads 3112. For example, the middle leads 3112 can have the middle lead profile 3138 with the lead side 3110 having the same contour all around the middle leads 3112.

The peripheral leads 3114 are defined as the leads having a planar side exposed and facing away from the middle leads 3112 and the innermost leads 3106. For example, the peripheral leads 3114 can be the leads having a different shape than the innermost leads 3106 and the middle leads 3112. For another example, the peripheral leads 3114 can locate at the peripheral edges of the integrated circuit packaging system 3000 having an outer vertical planar side 3116 exposed. An outer vertical side 3116 is defined as a side surface of the peripheral leads 3114 facing away from the innermost space 3104. For example, the outer vertical side 3116 can be coplanar with an encapsulation vertical side 3118. The innermost leads 3106, the middle leads 3112, and the peripheral leads 3114 can include a lead bottom side 3120.

The integrated circuit packaging system 3000 can include a paddle fragment 3128 which is defined as a support structure for mounting or attaching a semiconductor device thereon. For example, an integrated circuit 3126 having an adhesive 3124 mounted over the paddle fragment 3128 with the paddle fragment 3128 isolated from the innermost leads 3106. For another example, the paddle fragment 3128 can have a fragment bottom side 3136 coplanar with the lead bottom side 3120, which is defined as the bottom side of the leads. The fragment bottom side 3136 is defined as the bottom side of the paddle fragment 3128.

The integrated circuit packaging system 3000 can include the integrated circuit 3126 placed in the innermost space 3104. The integrated circuit 3126 is defined as chip with active circuitry fabricated thereon. For example, the integrated circuit 3126 can include a flip chip, a wire bonded chip, or a packaged integrated circuit. For another example, the integrated circuit packaging system 3000 can include the integrated circuit 3126 placed in the innermost space 3104 evenly spaced from the innermost leads 3106. For a different example, the integrated circuit 3126 can be placed in the innermost space 3104 adjacent to the innermost leads 3106. The integrated circuit 3126 can include a die bottom side 3122, which is defined as the non-active side of the integrated circuit 3126.

The package encapsulation 3002 can include the encapsulation vertical side 3118, which is defined as a side surface of the package encapsulation 3002 facing away from the innermost space 3104. For example, the encapsulation vertical side 3118 can be coplanar with the outer vertical side 3116 of the peripheral leads 3114.

The integrated circuit 3126 can have the adhesive 3124, which is defined as a sticky material for holding components in place. For example, the integrated circuit 3126 can have the adhesive 3124 adhered to the die bottom side 3122 of the integrated circuit 3126 with the adhesive 3124 exposed. For another example, the adhesive 3124 can include a resin, glue, paste, cement, putty, or a polyvinyl resin emulsion.

It has been discovered that having the die bottom side 3122 exposed improves the thermal performance of the integrated circuit 3126. Improving the thermal performance of the integrated circuit 3126 increases board level reliability and performance of the semiconductor device. The high thermal device package of the present invention can be applied to various semiconductor devices, thus, lowering the production cost.

A sealing space 3130 is defined as the opening between the innermost leads 3106 and the integrated circuit 3126. For example, the package encapsulation 3002 can fill in the sealing space 3130.

The innermost leads 3106, the middle leads 3112, and the peripheral leads 3114 can include a lead conductive top 3132, which is defined as a conductive cover at a top portion of the lead and provides electrical connectivity between a semiconductor device and the lead. For example, the integrated circuit and the lead array 3102 can be coupled with an electrical interconnect 3134 connecting the integrated circuit 3126 and the lead conductive top 3132.

The electrical interconnect 3134 is defined as a connection interface for electrical connection to other components. For example, the electrical interconnect 3134 can include a bondwire, solder columns, solder balls, conductive interconnects, or lateral interconnects. For this example, the electrical interconnect 3134 can represent a bondwire connecting the integrated circuit 3126 and the lead conductive top 3132.

Figure 32:
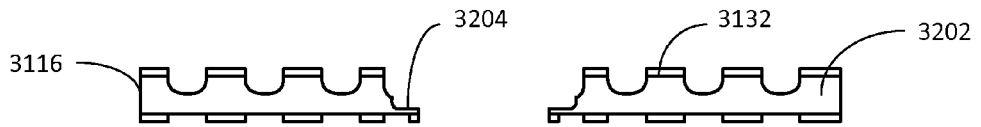
FIG. 32 is a cross-sectional view of a leadframe for manufacture of the integrated circuit packaging system of FIG. 30 after a providing phase of manufacture.

Referring now to FIG. 32, therein is shown a cross-sectional view of a leadframe 3202 for manufacture of the integrated circuit packaging system 3000 of FIG. 30 after a providing phase of manufacture. The leadframe 3202 is defined as an electrically conductive structure that provides manufacturing support and is incorporated into the integrated circuit packaging system 3000. The leadframe 3202 can be a metallic composition including copper, tin, zinc, or other conductive metal or alloys. For example, the leadframe 3202 can include the lead conductive top 3132 and the outer vertical side 3116. For another example, the leadframe 3202 can include a paddle area 3204, which is defined as a support structure for mounting or attaching a semiconductor device thereon. The paddle area 3204 can be disjointed with an opening in the center.

Figure 33:
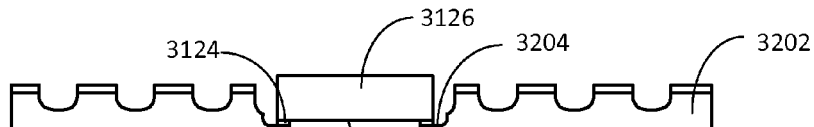
FIG. 33 is a cross-sectional view of the integrated circuit for manufacture of the integrated circuit packaging system of FIG. 30 after placing the integrated circuit having the adhesive over the paddle area of the leadframe.

Referring now to FIG. 33, therein is shown a cross-sectional view of the integrated circuit 3126 for manufacture of the integrated circuit packaging system 3000 of FIG. 30 after placing the integrated circuit 3126 having the adhesive 3124 over the paddle area 3204 of the leadframe 3202. For example, the adhesive 3124 can adhere the integrated circuit 3126 to the paddle area 3204.

The die bottom side 3122 can be coated with a layer of metallization or wetting layer for improving the adhesion to the integrated circuit 3126. For example, the layer of metallization can include nickel, platinum, palladium, cobalt, phosphorous, or a combination thereof.

Figure 34:
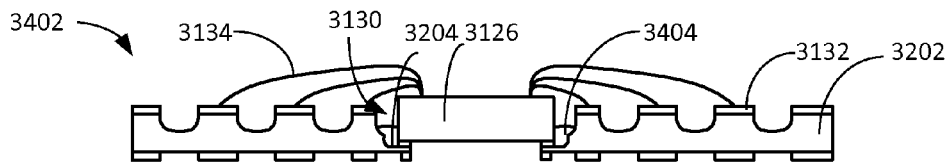
FIG. 34 is a cross-sectional view of a structure for manufacture of the integrated circuit packaging system of FIG. 30 after depositing a sealing filler in the sealing space over the paddle area.

Referring now to FIG. 34, therein is shown a cross-sectional view of a structure 3402 for manufacture of the integrated circuit packaging system 3000 of FIG. 30 after depositing a sealing filler 3404 in the sealing space 3130 over the paddle area 3204. The sealing filler 3404 is defined as a molding compound for sealing the sealing space 3130. For example, the sealing filler 3404 can include an epoxy molding compounded and a polycarbonate compound. The structure 3402 can include the integrated circuit 3126 placed over the paddle area 3204. The integrated circuit 3126 can be coupled to the leadframe 3202 by connecting the integrated circuit 3126 and the lead conductive top 3132 with the electrical interconnect 3134.

Figure 35:
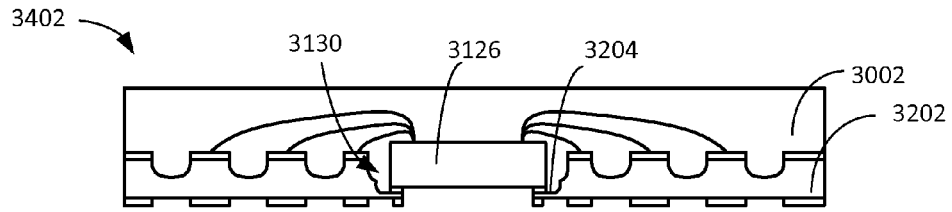
FIG. 35 is a cross-sectional view of the structure of FIG. 33 after a mold phase of manufacture.

Referring now to FIG. 35, therein is shown a cross-sectional view of the structure 3402 of FIG. 33 after a mold phase of manufacture. For example, the structure 3402 can include the package encapsulation 3002 formed over the integrated circuit 3126, the sealing space 3130, the sealing filler 3404 of FIG. 33, and the leadframe 3202. For another example, the structure 3402 can include the package encapsulation 3002 formed over the integrated circuit 3126, the sealing space 3130, the paddle area 3204, and the leadframe 3202.

It has been discovered that the application of the sealing filler 3404 can anticipate and prevent the potential mold bleeding problem from forming the package encapsulation 3002. The anticipation and prevention reduces the number of defective high thermal device package, thus, lowering the production cost.

Figure 36:
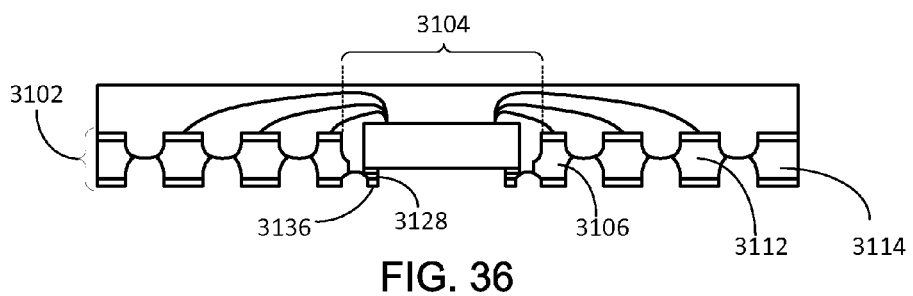
FIG. 36 is a first cross-sectional view of the integrated circuit packaging system of FIG. 31 after an etch phase of manufacture.

Referring now to FIG. 36, therein is shown a first cross-sectional view of the integrated circuit packaging system 3000 of FIG. 31 after an etch phase of manufacture. The integrated circuit packaging system 3000 can include the lead array 3102 having the innermost space 3104, the innermost leads 3106, the middle leads 3112, and the peripheral leads 3114 with the paddle fragment 3128 having the fragment bottom side 3136 exposed after etching the leadframe 3202 of FIG. 35.

Figure 37:
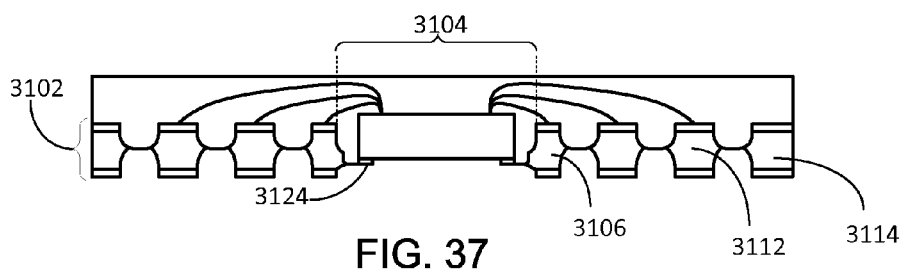
FIG. 37 is a second cross-sectional view of the integrated circuit packaging system of FIG. 31 after an etch phase of manufacture.

Referring now to FIG. 37, therein is shown a second cross-sectional view of the integrated circuit packaging system 3000 of FIG. 31 after an etch phase of manufacture. The integrated circuit packaging system 3000 can include the lead array 3102 having the innermost space 3104, the innermost leads 3106, the middle leads 3112, and the peripheral leads 3114 with the adhesive 3124 exposed after etching the leadframe 3202 of FIG. 35.

Figure 38:
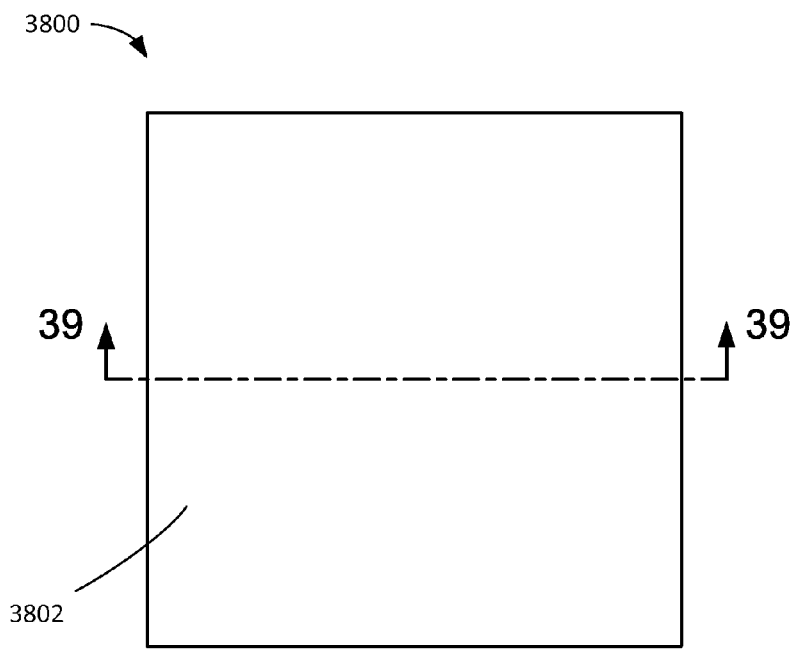
FIG. 38 is a top view of an integrated circuit packaging system in a sixth embodiment of the present invention.

Referring now to FIG. 38, therein is shown a top view of an integrated circuit packaging system 3800 in a sixth embodiment of the present invention. The integrated circuit packaging system 3800 can include a package encapsulation 3802. The package encapsulation 3802 is defined as a cover surrounding and protecting the contents in the integrated circuit packaging system 3800 from the environment. The package encapsulation 3802 can be an epoxy molding, other protective molding, or other encasement structure.

Figure 39:
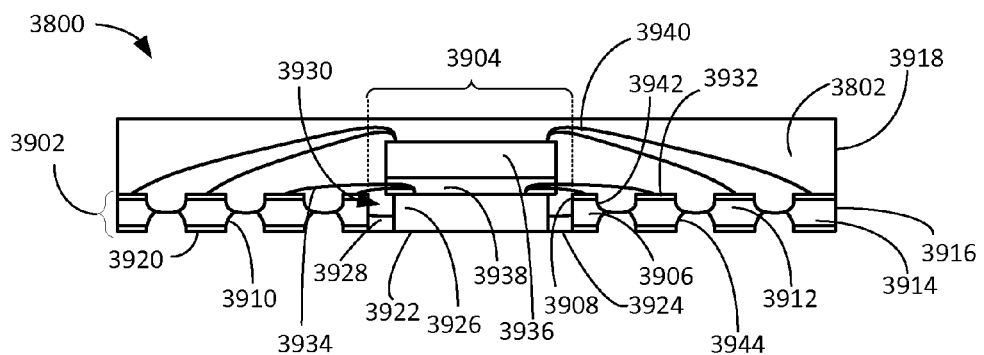
FIG. 39 is a cross-sectional view of the integrated circuit packaging system along the line 39-39 of FIG. 38.

Referring now to FIG. 39, therein is shown a cross-sectional view of the integrated circuit packaging system 3800 along the line 39-39 of FIG. 38. The integrated circuit packaging system 3800 can include a lead array 3902 having an innermost space 3904 with innermost leads 3906 having an inner lead profile 3942 different around an inner non-horizontal side 3908 of the innermost leads 3906.

A lead in the lead array 3902 is defined as a conductive structure that provides connectivity for an electrical signal or an electrical potential level between the integrated circuit packaging system 3800 and an external system (not shown). For example, the lead array 3902 can include the innermost leads 3906, middle leads 3912, and peripheral leads 3914.

The lead array 3902 can include the innermost space 3904, which is defined as an opening in the lead array 3902 most central to the integrated circuit packaging system 3800. For example, the innermost space 3904 can locate in the center of the lead array 3902. For another example, the innermost space 3904 can locate between the innermost leads 3906.

The innermost leads 3906 are defined as the leads of the lead array 3902 that are the most central to the integrated circuit packaging system 3800. For example, the innermost leads 3906 can be the leads having a different shape than the middle leads 3912 and the peripheral leads 3914. For a different example, the innermost leads 3906 can be located adjacent to the innermost space 3904. For another example, the innermost leads 3906 can be reduced in size compared to the middle leads 3912 and peripheral leads 3914 by a process of sawing, shearing, laser trimming, or the like.

The innermost leads 3906 can include the inner non-horizontal side 3908, which is defined as a side surface of the innermost leads 3906. For example, the inner non-horizontal side 3908 can be adjacent to and facing the innermost space 3904. For this example, the inner non-horizontal side 3908 can represent a vertical side.

The innermost leads 3906 can have the inner lead profile 3942, which is defined as the contour representing a non-horizontal surface of the innermost leads 3906. For example, the inner lead profile 3942 of the innermost leads 3906 facing the innermost space 3904 can have the inner non-horizontal side 3908 that is vertical. In contrast, the inner lead profile 3942 of the innermost leads 3906 facing away from the innermost space 3904 can have the inner non-horizontal side 3908 that is concaved with an outthrust.

The middle leads 3912 are defined as the leads of the lead array 3902 that electrically connects the internal and external portion of the integrated circuit package system 3800. For example, the middle leads 3912 can be the leads in the lead array 3902 between the innermost lead 3906 and the peripheral lead 3914. For different example, the middle leads 3912 can be the leads having a different shape than the innermost leads 3906 and the peripheral leads 3914. For another example, one of the middle leads 3912 can locate between the innermost leads 3906 and another of the middle leads 3912. For different example, one of the middle leads 3912 can locate between two of another of the middle leads 3912. For another example, one of the middle leads 3912 can locate between another of the middle leads 3912 and the peripheral leads 3914.

The middle leads 3912 can include a lead side 3910, which is defined as a side surface of the middle leads 3912. For this example, the lead side 3910 and the inner non-horizontal side 3908 can have different contours, because the inner non-horizontal side 3908 can have a geometric configuration of a vertical planar side on one side while the lead side 3910 can have a geometric configuration of an outthrust on all sides.

The middle leads 3912 can have a middle lead profile 3944, which is defined as the contour representing a non-horizontal surface of the middle leads 3912. For example, the middle leads 3912 can have the middle lead profile 3944 with the lead side 3910 having the same contour all around the middle leads 3912.

The peripheral leads 3914 are defined as the leads having a planar side exposed and facing away from the middle leads 3912 and the innermost leads 3906. For example, the peripheral leads 3914 can be the leads having a different shape than the innermost leads 3906 and the middle leads 3912. For another example, the peripheral leads 3914 can locate at the peripheral edges of the integrated circuit packaging system 3800 having an outer vertical planar side 3916 exposed. An outer vertical side 3916 is defined as a side surface of the peripheral leads 3914 facing away from the innermost space 3904. For example, the outer vertical side 3916 can be coplanar with an encapsulation vertical side 3918.

The package encapsulation 3802 can include the encapsulation vertical side 3918, which is defined as a side surface of the package encapsulation 3802 facing away from the innermost space 3904. For example, the encapsulation vertical side 3918 can be coplanar with the outer vertical side 3916 of the peripheral leads 3914.

The innermost leads 3906, the middle leads 3912, and the peripheral leads 3914 can include a lead bottom side 3920. For example, the lead bottom side 3920 can be coplanar with a die bottom side 3922.

The integrated circuit packaging system 3800 can include a bottom integrated circuit 3926 placed in the innermost space 3904 evenly spaced from the innermost leads 3906. The bottom integrated circuit 3926 is defined as chip with active circuitry fabricated thereon. For example, the bottom integrated circuit 3926 can include a flip chip, a wire bonded chip, or a packaged integrated circuit. For another example, the bottom integrated circuit 3926 can be placed in the innermost space 3904 adjacent to the innermost leads 3906.

The bottom integrated circuit 3926 can include the die bottom side 3922. For example, the die bottom side 3922 can be coplanar with the lead bottom side 3920.

The integrated circuit packaging system 3800 can include a sealing filler 3928 for sealing a sealing space 3930 between the innermost leads 3906 and the bottom integrated circuit 3926 with the bottom integrated circuit 3926 and the sealing filler 3928 exposed. The sealing filler 3928 is defined as a molding compound for sealing the sealing space 3930. For example, the sealing filler 3928 can include an epoxy molding compound and a polycarbonate compound. For another example, the sealing filler 3928 can be applied for sealing the sealing space 3930 between the innermost leads 3906 and the bottom integrated circuit 3926.

The sealing filler 3928 can include a filler bottom side 3924. For example, the lead bottom side 3920 of the lead array 3902 can be formed to be coplanar with the die bottom side 3922 of the bottom integrated circuit 3926 and the filler bottom side 3924 of the sealing filler 3928 with the lead bottom side 3920, the die bottom side 3922 and the filler bottom side 3924 exposed.

It has been discovered that having the die bottom side 3922 coplanar with the lead bottom side 3920 and the filler bottom side 3924 for exposing the die bottom side 3922 improves the thermal performance of the bottom integrated circuit 3926 and a top integrated circuit 3936. Improving the thermal performance of the bottom integrated circuit 3926 and the top integrated circuit 3936 increases board level reliability and performance of the semiconductor device. The high thermal device package of the present invention can be applied to various semiconductor devices, thus, lowering the production cost.

The sealing space 3930 is defined as the opening between the innermost leads 3906 and the bottom integrated circuit 3926. For example, the sealing filler 3928 can be applied in the sealing space 3930 to prevent bleeding of the epoxy molding compound from forming the package encapsulation 3802.

It has been discovered that the application of the sealing filler 3928 can prevent the potential mold bleeding problem from forming the package encapsulation 3802. Furthermore, the inner lead profile 3942 having the inner non-horizontal side 3908 different around the innermost leads 3906 improves the application of the sealing filler 3928 in the sealing space 3930, thus, improving the prevention of the mold bleeding problem. The prevention reduces the number of defective high thermal device package, thus, lowering the production cost.

The innermost leads 3906, the middle leads 3912, and the peripheral leads 3914 can include a lead conductive top 3932, which is defined as a conductive cover at a top portion of the lead and provides electrical connectivity between a semiconductor device and the lead. For example, the bottom integrated circuit 3926 and the lead array 3902 can be coupled with a bottom electrical interconnect 3934 connecting the bottom integrated circuit 3926 and the lead conductive top 3932.

The integrated circuit packaging system 3800 can include the top integrated circuit 3936 having a wire-in-film adhesive 3938 placed in the innermost space 3904 for mounting over the bottom integrated circuit 3926 and the sealing filler 3928. The top integrated circuit 3936 is defined as chip with active circuitry fabricated thereon. For example, the top integrated circuit 3936 can include a flip chip, a wire bonded chip, or a packaged integrated circuit.

The wire-in-film adhesive 3938 is defined as a sticky material for holding components in place having the bottom electrical interconnect 3934 in the sticky material. The bottom electrical interconnect 3934 is defined as a connection interface for electrical connection to other components. For example, the bottom electrical interconnect 3934 can include a bondwire, solder columns, solder balls, conductive interconnects, or lateral interconnects. For this example, the bottom electrical interconnect 3934 can represent a bondwire connecting the bottom integrated circuit 3926 and the lead conductive top 3932.

A top electrical interconnect 3940 is defined as a connection interface for electrical connection to other components. For example, the top electrical interconnect 3940 can include a bondwire, solder columns, solder balls, conductive interconnects, or lateral interconnects. For this example, the top electrical interconnect 3940 can represent a bondwire connecting the top integrated circuit 3936 and the lead conductive top 3932.

Figure 40:
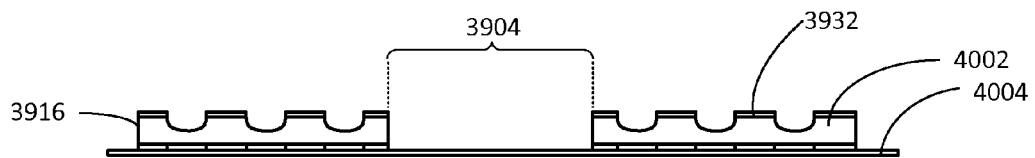
FIG. 40 is a cross-sectional view of a leadframe mounted over a tape for manufacture of the integrated circuit packaging system of FIG. 38 after a mounting phase of manufacture.

Referring now to FIG. 40, therein is shown a cross-sectional view of a leadframe 4002 mounted over a tape 4004 for manufacture of the integrated circuit packaging system 3800 of FIG. 38 after a mounting phase of manufacture. The tape 4004 is defined as a sticky material having a thermal resistant adhesive for holding components in place. For example, the tape 4004 can include a base film as the bottom layer and an ultraviolet B-stage film adhesive layer as the top layer.

The leadframe 4002 is defined as an electrically conductive structure that provides manufacturing support and is incorporated into the integrated circuit packaging system 3800. The leadframe 4002 can be a metallic composition including copper, tin, zinc, or other conductive metal or alloys. For example, the leadframe 4002 can include the lead conductive top 3932 and the outer vertical side 3916. For another example, the leadframe 4002 can include the innermost space 3904 with the tape 4004 as the bottom of the innermost space 3904.

Figure 41:
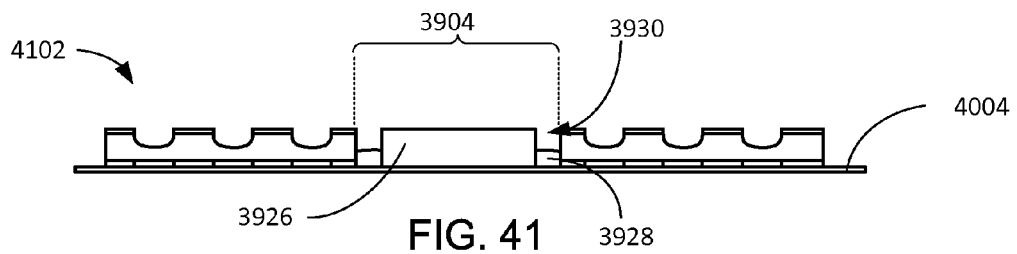
FIG. 41 is a cross-sectional view of a structure for manufacture of the integrated circuit packaging system of FIG. 38 after placing the bottom integrated circuit in the innermost space.

Referring now to FIG. 41, therein is shown a cross-sectional view of a structure 4102 for manufacture of the integrated circuit packaging system 3800 of FIG. 38 after placing the bottom integrated circuit 3926 in the innermost space 3904. The structure 4102 can include the bottom integrated circuit 3926 placed in the innermost space 3904 of the leadframe 4002 over the tape 4004. Furthermore, the sealing filler 3928 can be deposited in the sealing space 3930.

Figure 42:
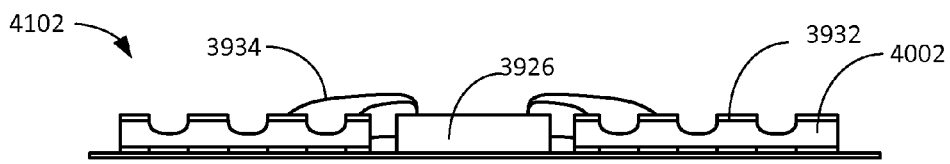
FIG. 42 is a cross-sectional view of the structure of FIG. 41 after an electrical connection phase of manufacture.

Referring now to FIG. 42, therein is shown a cross-sectional view of the structure 4102 of FIG. 41 after an electrical connection phase of manufacture. The bottom integrated circuit 3926 can be coupled to the leadframe 4002 by connecting the bottom integrated circuit 3926 and the lead conductive top 3932 with the bottom electrical interconnect 3934.

Figure 43:
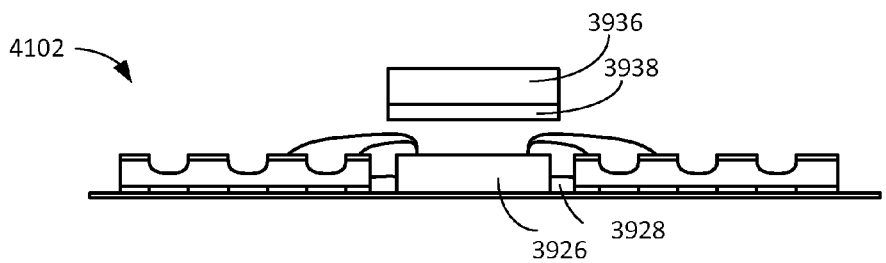
FIG. 43 is a cross-sectional view of the structure of FIG. 42 for manufacture of the integrated circuit packaging system of FIG. 38 after mounting the top integrated circuit over the bottom integrated circuit.

Referring now to FIG. 43, therein is shown a cross-sectional view of the structure 4102 of FIG. 42 for manufacture of the integrated circuit packaging system 3800 of FIG. 38 after mounting the top integrated circuit 3936 over the bottom integrated circuit 3926. The top integrated circuit 3936 having the wire-in-film adhesive 3938 can be mounted over the bottom integrated circuit 3926 and the sealing filler 3928.

Figure 44:
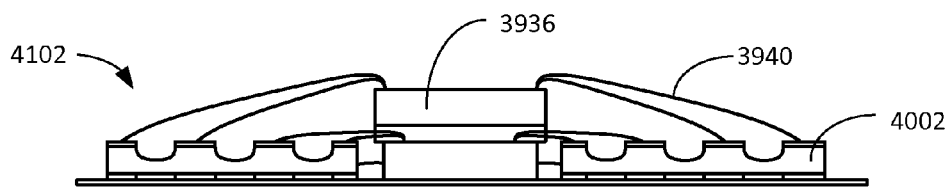
FIG. 44 is a cross-sectional view of the structure of FIG. 43 after an electrical connection phase of manufacture.

Referring now to FIG. 44, therein is shown a cross-sectional view of the structure 4102 of FIG. 43 after an electrical connection phase of manufacture. The top integrated circuit 3936 can be coupled to the leadframe 4002 by connecting the top integrated circuit 3936 and the lead conductive top 3932 with the top electrical interconnect 3940.

Figure 45:
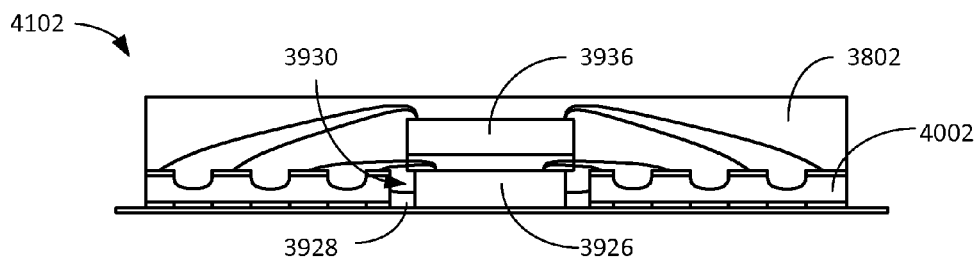
FIG. 45 is a cross-sectional view of the structure of FIG. 44 after a mold phase of manufacture.

Referring now to FIG. 45, therein is shown a cross-sectional view of the structure 4102 of FIG. 44 after a mold phase of manufacture. The structure 4102 can include the package encapsulation 3802 formed over the bottom integrated circuit 3926, the top integrated circuit 3936, the sealing space 3930, the sealing filler 3928, and the leadframe 4002.

Figure 46:
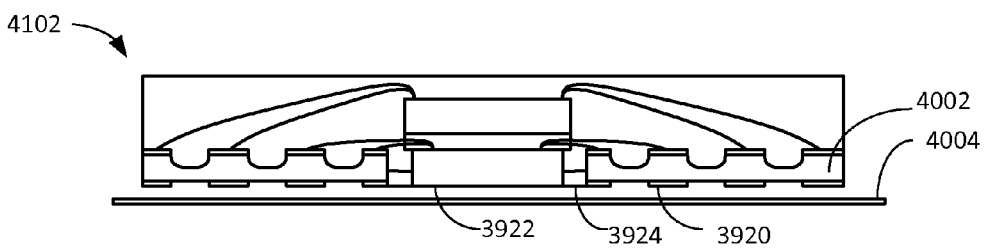
FIG. 46 is a cross-sectional view of the structure of FIG. 45 after removal phase of manufacture.

Referring now to FIG. 46, therein is shown a cross-sectional view of the structure 4102 of FIG. 45 after removal phase of manufacture. The tape 4004 can be removed from the structure 4102 for exposing the lead bottom side 3920 of the leadframe 4002, the filler bottom side 3924, and the die bottom side 3922.

Figure 47:
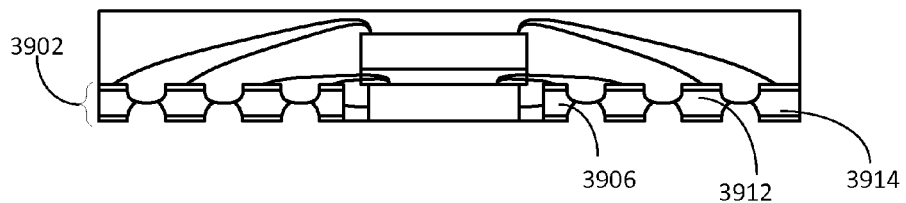
FIG. 47 is a cross-sectional view of the integrated circuit packaging system of FIG. 39 after an etch phase of manufacture.

Referring now to FIG. 47, therein is shown a cross-sectional view of the integrated circuit packaging system 3800 of FIG. 39 after an etch phase of manufacture. The integrated circuit packaging system 3800 of FIG. 39 can include the lead array 3902 having the innermost leads 3906, the middle leads 3912, and the peripheral leads 3914 after etching the leadframe 4002 of FIG. 46.

Figure 48:
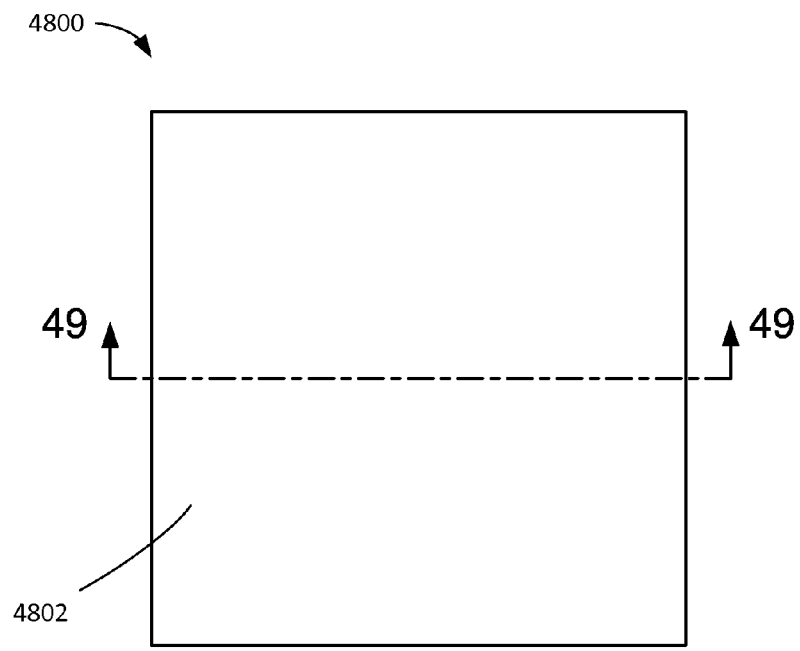
FIG. 48 is a top view of an integrated circuit packaging system in a seventh embodiment of the present invention.

Referring now to FIG. 48, therein is shown a top view of an integrated circuit packaging system 4800 in a seventh embodiment of the present invention. The integrated circuit packaging system 4800 can include a package encapsulation 4802. The package encapsulation 4802 is defined as a cover surrounding and protecting the contents in the integrated circuit packaging system 4800 from the environment. The package encapsulation 4802 can be an epoxy molding, other protective molding, or other encasement structure.

Figure 49:
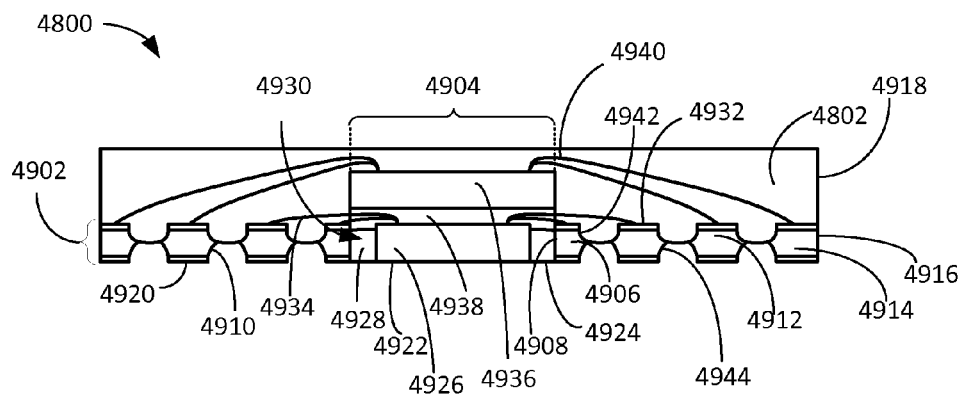
FIG. 49 is a cross-sectional view of the integrated circuit packaging system along the line 49-49 of FIG. 48.

Referring now to FIG. 49, therein is shown a cross-sectional view of the integrated circuit packaging system 4800 along the line 49-49 of FIG. 48. The integrated circuit packaging system 4800 can include a lead array 4902 having an innermost space 4904 with innermost leads 4906 having an inner lead profile 4942 different around an inner non-horizontal side 4908 of the innermost leads 4906.

A lead in the lead array 4902 is defined as a conductive structure that provides connectivity for an electrical signal or an electrical potential level between the integrated circuit packaging system 4800 and an external system (not shown). For example, the lead array 4902 can include the innermost leads 4906, the middle leads 4912, and peripheral leads 4914.

The lead array 4902 can include the innermost space 4904, which is defined as an opening in the lead array 4902 most central to the integrated circuit packaging system 4800. For example, the innermost space 4904 can locate in the center of the lead array 4902. For another example, the innermost space 4904 can locate between the innermost leads 4906.

The innermost leads 4906 are defined as the leads of the lead array 4902 that are the most central to the integrated circuit packaging system 4800. For example, the innermost leads 4906 can be the leads having a different shape than the middle leads 4912 and the peripheral leads 4914. For a different example, the innermost leads 4906 can be located adjacent to the innermost space 4904. For another example, the innermost leads 4906 can be reduced in size compared to the middle leads 4912 and peripheral leads 4914 by a process of sawing, shearing, laser trimming, or the like.

The innermost leads 4906 can include the inner non-horizontal side 4908, which is defined as a side surface of the innermost leads 4906. For example, the inner non-horizontal side 4908 can be adjacent to and facing the innermost space 4904. For this example, the inner non-horizontal side 4908 can represent a vertical side.

The innermost leads 4906 can have the inner lead profile 4942, which is defined as the contour representing a non-horizontal surface of the innermost leads 4906. For example, the inner lead profile 4942 of the innermost leads 4906 facing the innermost space 4904 can have the inner non-horizontal side 4908 that is vertical. In contrast, the inner lead profile 4942 of the innermost leads 4906 facing away from the innermost space 4904 can have the inner non-horizontal side 4908 that is concaved with an outthrust.

The middle leads 4912 are defined as the leads of the lead array 4902 that electrically connects the internal and external portion of the integrated circuit package system 4800. For example, the middle leads 4912 can be the leads in the lead array 4902 between the innermost lead 4906 and the peripheral lead 4914. For different example, the middle leads 4912 can be the leads having a different shape than the innermost leads 4906 and the peripheral leads 4914. For another example, one of the middle leads 4912 can locate between the innermost leads 4906 and another of the middle leads 4912. For different example, one of the middle leads 4912 can locate between two of another of the middle leads 4912. For another example, one of the middle leads 4912 can locate between another of the middle leads 4912 and the peripheral leads 4914.

The middle leads 4912 can include a lead side 4910, which is defined as a side surface of the middle leads 4912. For this example, the lead side 4910 and the inner non-horizontal side 4908 can have different contours, because the inner non-horizontal side 4908 can have a geometric configuration of a vertical planar side on one side while the lead side 4910 can have a geometric configuration of an outthrust on all sides.

The middle leads 4912 can have a middle lead profile 4944, which is defined as the contour representing a non-horizontal surface of the middle leads 4912. For example, the middle leads 4912 can have the middle lead profile 4944 with the lead side 4910 having the same contour all around the middle leads 4912.

The peripheral leads 4914 are defined as the leads having a planar side exposed and facing away from the middle leads 4912 and the innermost leads 4906. For example, the peripheral leads 4914 can be the leads having a different shape than the innermost leads 4906 and the middle leads 4912. For another example, the peripheral leads 4914 can locate at the peripheral edges of the integrated circuit packaging system 4800 having an outer vertical planar side 4916 exposed. An outer vertical side 4916 is defined as a side surface of the peripheral leads 4914 facing away from the innermost space 4904. For example, the outer vertical side 4916 can be coplanar with an encapsulation vertical side 4918.

The package encapsulation 4802 can include the encapsulation vertical side 4918, which is defined as a side surface of the package encapsulation 4802 facing away from the innermost space 4904. For example, the encapsulation vertical side 4918 can be coplanar with the outer vertical side 4916 of the peripheral leads 4914.

The innermost leads 4906, the middle leads 4912, and the peripheral leads 4914 can include a lead bottom side 4920. For example, the lead bottom side 4920 can be coplanar with a die bottom side 4922.

The integrated circuit packaging system 4800 can include a bottom integrated circuit 4926 placed in the innermost space 4904 evenly spaced from the innermost leads 4906. The bottom integrated circuit 4926 is defined as chip with active circuitry fabricated thereon. For example, the bottom integrated circuit 4926 can include a flip chip, a wire bonded chip, or a packaged integrated circuit. For another example, the bottom integrated circuit 4926 can be placed in the innermost space 4904 adjacent to the innermost leads 4906.

The bottom integrated circuit 4926 can include the die bottom side 4922. For example, the die bottom side 4922 can be coplanar with the lead bottom side 4920.

The integrated circuit packaging system 4800 can include a sealing filler 4928 for sealing a sealing space 4930 between the innermost leads 4906 and the bottom integrated circuit 4926 with the bottom integrated circuit 4926 and the sealing filler 4928 exposed. The sealing filler 4928 is defined as a molding compound for sealing the sealing space 4930. For example, the sealing filler 4928 can include an epoxy molding compound and a polycarbonate compound. For another example, the sealing filler 4928 can be applied for sealing the sealing space 4930 between the innermost leads 4906 and the bottom integrated circuit 4926.

The sealing filler 4928 can include a filler bottom side 4924, which is defined as the bottom side of the sealing filler 4928. For example, the lead bottom side 4920 of the lead array 4902 can be formed to be coplanar with the die bottom side 4922 of the bottom integrated circuit 4926 and the filler bottom side 4924 of the sealing filler 4928 with the lead bottom side 4920, the die bottom side 4922 and the filler bottom side 4924 exposed.

It has been discovered that having the die bottom side 4922 coplanar with the lead bottom side 4920 and the filler bottom side 4924 for exposing the die bottom side 4922 improves the thermal performance of the bottom integrated circuit 4926 and the top integrated circuit 4936. Improving the thermal performance of the bottom integrated circuit 4926 and the top integrated circuit 4936 increases board level reliability and performance of the semiconductor device. The high thermal device package of the present invention can be applied to various semiconductor devices, thus, lowering the production cost.

The sealing space 4930 is defined as the opening between the innermost leads 4906 and the bottom integrated circuit 4926. For example, the sealing filler 4928 can be applied in the sealing space 4930 to prevent bleeding of the epoxy molding compound from forming the package encapsulation 4802.

It has been discovered that the application of the sealing filler 4928 can prevent the potential mold bleeding problem from forming the package encapsulation 4802. Furthermore, the inner lead profile 4942 having the inner non-horizontal side 4908 different around the innermost leads 4906 improves the application of the sealing filler 4928 in the sealing space 4930, thus, improving the prevention of the mold bleeding problem. The prevention reduces the number of defective high thermal device package, thus, lowering the production cost.

The innermost leads 4906, the middle leads 4912, and the peripheral leads 4914 can include a lead conductive top 4932, which is defined as a component that covers a top portion of the lead and provides electrical connectivity between a semiconductor device and the lead. For example, the bottom integrated circuit 4926 and the lead array 4902 can be coupled with a bottom electrical interconnect 4934 connecting the bottom integrated circuit 4926 and the lead conductive top 4932.

The integrated circuit packaging system 4800 can include a top integrated circuit 4936 having a wire-in-film adhesive 4938 placed in the innermost space 4904 for mounting over the bottom integrated circuit 4926 and the sealing filler 4928 with the sealing filler 4928 for enclosing the sealing space 4930. For example, the sealing filler 4928 can be applied for sealing the sealing space 4930 by the sealing filler 4928 contacting the wire-in-film adhesive, the innermost leads 4906 and the bottom integrated circuit 4926.

The top integrated circuit 4936 is defined as chip with active circuitry fabricated thereon. For example, the top integrated circuit 4936 can include a flip chip, a wire bonded chip, or a packaged integrated circuit.

The wire-in-film adhesive 4938 is defined as the sticky material for holding components in place having the bottom electrical interconnect 4934 in the sticky material. The bottom electrical interconnect 4934 is defined as a connection interface for electrical connection to other components. For example, the bottom electrical interconnect 4934 can include a bondwire, solder columns, solder balls, conductive interconnects, or lateral interconnects. For this example, the bottom electrical interconnect 4934 can represent a bondwire connecting the bottom integrated circuit 4926 and the lead conductive top 4932.

A top electrical interconnect 4940 is defined as a connection interface for electrical connection to other components. For example, the top electrical interconnect 4940 can include a bondwire, solder columns, solder balls, conductive interconnects, or lateral interconnects. For this example, the top electrical interconnect 4940 can represent a bondwire connecting the top integrated circuit 4936 and the lead conductive top 4932.

Figure 50:
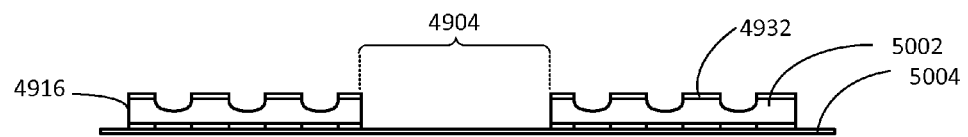
FIG. 50 is a cross-sectional view of a leadframe mounted over a tape for manufacture of the integrated circuit packaging system of FIG. 48 after a mounting phase of manufacture.

Referring now to FIG. 50, therein is shown a cross-sectional view of a leadframe 5002 mounted over a tape 5004 for manufacture of the integrated circuit packaging system 4800 of FIG. 48 after a mounting phase of manufacture. The tape 5004 is defined as a sticky material having a thermal resistant adhesive for holding components in place. For example, the tape 5004 can include a base film as the bottom layer and an ultraviolet B-stage film adhesive layer as the top layer.

The leadframe 5002 is defined as an electrically conductive structure that provides manufacturing support and is incorporated into the integrated circuit packaging system 4800. The leadframe 5002 can be a metallic composition including copper, tin, zinc, or other conductive metal or alloys. For example, the leadframe 5002 can include the lead conductive top 4932 and the outer vertical side 4916. For another example, the leadframe 5002 can include the innermost space 4904 with the tape 5004 as the bottom of the innermost space 4904.

Figure 51:
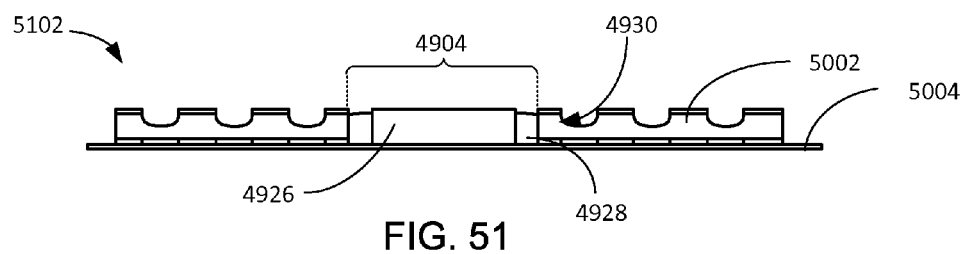
FIG. 51 is a cross-sectional view of a structure for manufacture of the integrated circuit packaging system of FIG. 48 after placing the bottom integrated circuit in the innermost space.

Referring now to FIG. 51, therein is shown a cross-sectional view of a structure 5102 for manufacture of the integrated circuit packaging system 4800 of FIG. 48 after placing the bottom integrated circuit 4926 in the innermost space 4904. The structure 5102 can include the bottom integrated circuit 4926 placed in the innermost space 4904 of the leadframe 5002 over the tape 5004. Furthermore, the sealing filler 4928 can be deposited in the sealing space 4930.

Figure 52:
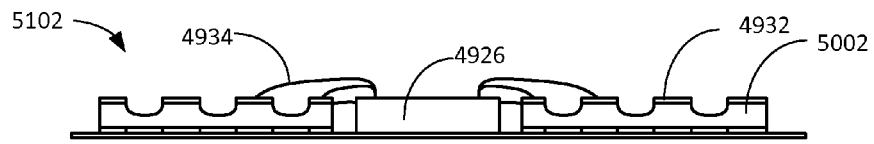
FIG. 52 is a cross-sectional view of the structure of FIG. 51 after an electrical connection phase of manufacture.

Referring now to FIG. 52, therein is shown a cross-sectional view of the structure 5102 of FIG. 51 after an electrical connection phase of manufacture. The bottom integrated circuit 4926 can be coupled to the leadframe 5002 by connecting the bottom integrated circuit 4926 and the lead conductive top 4932 with the bottom electrical interconnect 4934.

Figure 53:
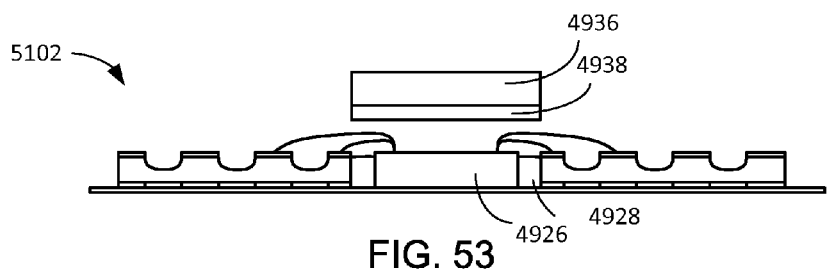
FIG. 53 is a cross-sectional view of the structure of FIG. 52 for manufacture of the integrated circuit packaging system of FIG. 48 after mounting the top integrated circuit over the bottom integrated circuit.

Referring now to FIG. 53, therein is shown a cross-sectional view of the structure 5102 of FIG. 52 for manufacture of the integrated circuit packaging system 4800 of FIG. 48 after mounting the top integrated circuit 4936 over the bottom integrated circuit 4926. The top integrated circuit 4936 having the wire-in-film adhesive 4938 can be mounted over the bottom integrated circuit 4926 and the sealing filler 4928.

Figure 54:
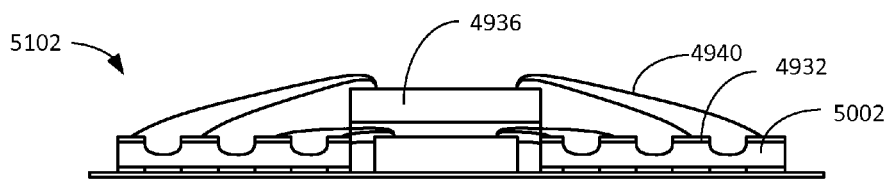
FIG. 54 is a cross-sectional view of the structure of FIG. 53 after an electrical connection phase of manufacture.

Referring now to FIG. 54, therein is shown a cross-sectional view of the structure 5102 of FIG. 53 after an electrical connection phase of manufacture. The top integrated circuit 4936 can be coupled to the leadframe 5002 by connecting the top integrated circuit 4936 and the lead conductive top 4932 with the top electrical interconnect 4940.

Figure 55:
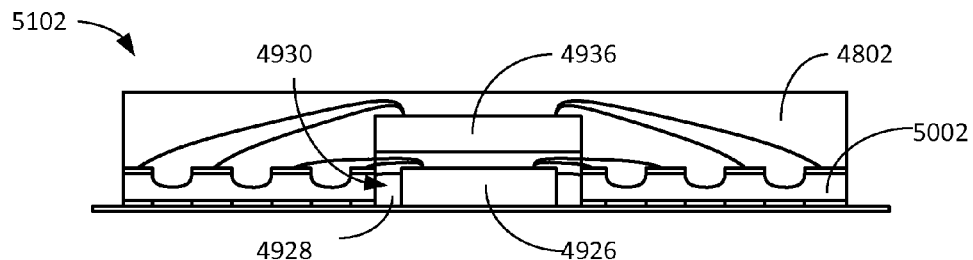
FIG. 55 is a cross-sectional view of the structure of FIG. 54 after a mold phase of manufacture.

Referring now to FIG. 55, therein is shown a cross-sectional view of the structure 5102 of FIG. 54 after a mold phase of manufacture. The structure 5102 can include the package encapsulation 4802 formed over the bottom integrated circuit 4926, the top integrated circuit 4936, the sealing space 4930, the sealing filler 4928, and the leadframe 5002.

Figure 56:
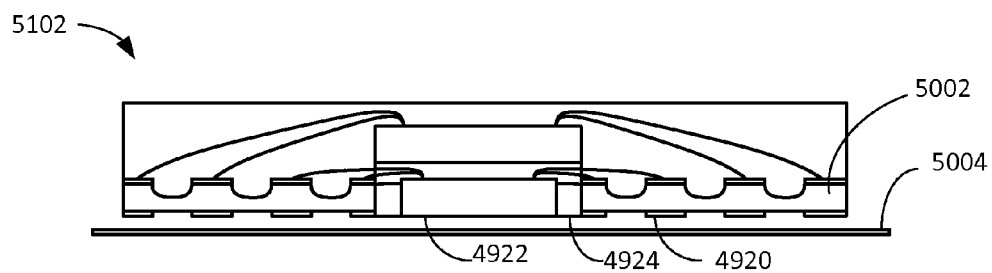
FIG. 56 is a cross-sectional view of the structure of FIG. 55 after removal phase of manufacture.

Referring now to FIG. 56, therein is shown a cross-sectional view of the structure 5102 of FIG. 55 after removal phase of manufacture. The tape 5004 can be removed from the structure 5102 for exposing the lead bottom side 4920 of the leadframe 5002, the filler bottom side 4924, and the die bottom side 4922.

Figure 57:
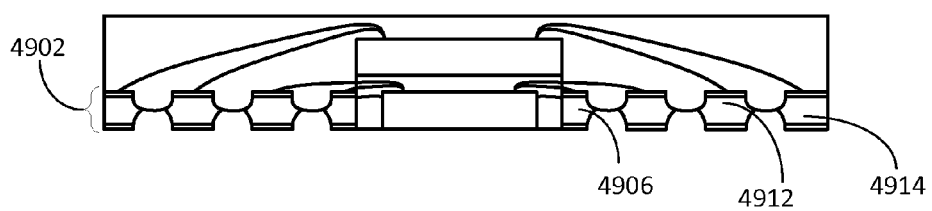
FIG. 57 is a cross-sectional view of the integrated circuit packaging system of FIG. 49 after an etch phase of manufacture.

Referring now to FIG. 57, therein is shown a cross-sectional view of the integrated circuit packaging system 4800 of FIG. 49 after an etch phase of manufacture. The integrated circuit packaging system 4800 can include the lead array 4902 having the innermost leads 4906, the middle leads 4912, and the peripheral leads 4914 after etching the leadframe 5002 of FIG. 56.

Figure 58:
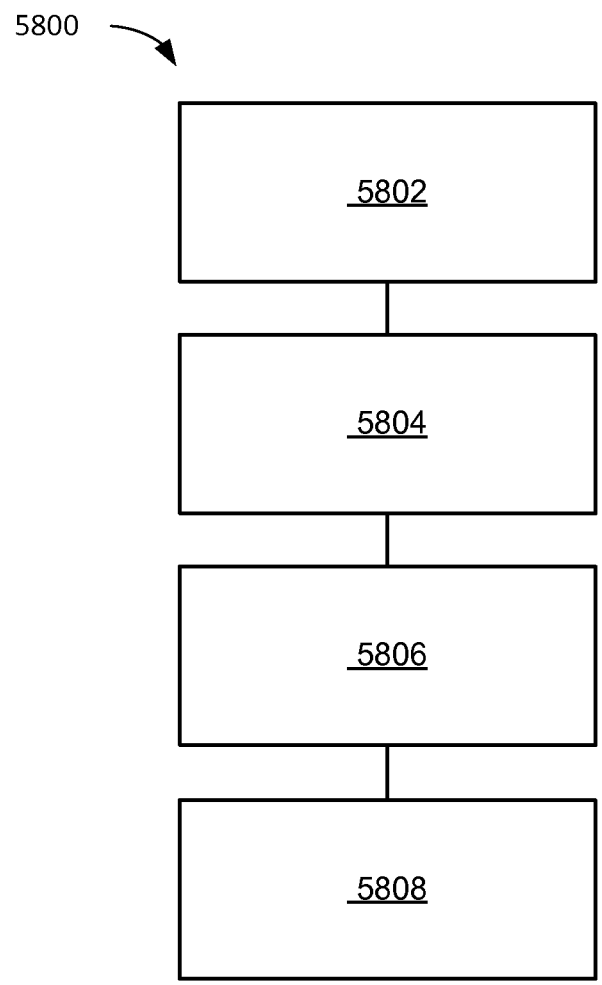
FIG. 58 is a flow chart of a method of manufacture of an integrated circuit packaging system in a further embodiment of the present invention.

Referring now to FIG. 58, therein is shown a flow chart of a method 5800 of manufacture of an integrated circuit packaging system in a further embodiment of the present invention. The method 5800 includes: forming a lead array having an innermost space with an innermost lead having an inner lead profile different around an inner non-horizontal side of the innermost lead in a block 5802; forming a middle lead having a middle lead profile the same around a lead side of the middle lead in a block 5804; placing an integrated circuit in the innermost space adjacent to the innermost lead in a block 5806; and forming a package encapsulation over the integrated circuit, the innermost lead, and the middle lead in a block 5808.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a lead array having an innermost space with an innermost lead having an inner lead profile different around an inner non-horizontal side of the innermost lead and a middle lead adjacent to the innermost lead;
   placing an integrated circuit in the innermost space adjacent to the innermost lead, wherein the inner non-horizontal side is planar and facing the integrated circuit;
   applying a sealing filler in a sealing space directly and only between the innermost lead and the integrated circuit, the sealing filler having a filler bottom side coplanar with a die bottom side of the integrated circuit before completely forming the innermost lead and the middle lead with the innermost lead between the sealing filler and the middle lead;
   connecting an electrical interconnect to the integrated circuit and the middle lead; and
   forming a package encapsulation over the integrated circuit, the innermost lead, and the middle lead, the package encapsulation partially in the sealing space and directly on the sealing filler in the sealing space and the electrical interconnect.

2. The method as claimed in claim 1 wherein forming the package encapsulation includes forming the package encapsulation partially exposing the integrated circuit and the sealing filler.

3. The method as claimed in claim 1 wherein forming the lead array includes forming a lead bottom side of the lead array coplanar with a die bottom side of the integrated circuit and a filler bottom side of the sealing filler with the lead bottom side, the die bottom side, and the filler bottom side exposed.

4. A method of manufacture of an integrated circuit packaging system comprising:
   forming a lead array having an innermost space with an innermost lead having an inner lead profile different around an inner non-horizontal side of the innermost lead and a middle lead adjacent to the innermost lead;
   placing an integrated circuit in the innermost space adjacent to the innermost lead, wherein the inner non-horizontal side is planar and facing the integrated circuit;

applying a sealing filler in a sealing space directly and only between the innermost lead and the integrated circuit, the sealing filler having a filler bottom side coplanar with a die bottom side of the integrated circuit before completely forming the innermost lead and the middle lead with the innermost lead between the sealing filler and the middle lead;

connecting an electrical interconnect to the integrated circuit and the middle lead;

connecting another of the electrical interconnect to the integrated circuit and the innermost lead; and forming a package encapsulation over the integrated circuit, the innermost lead, and the middle lead, the package encapsulation partially in the sealing space and directly on the sealing filler in the sealing space and the electrical interconnect.

5. An integrated circuit packaging system comprising:

a lead array having an innermost space with an innermost lead having an inner lead profile different around an inner non-horizontal side of the innermost lead and a middle lead adjacent to the innermost lead;

an integrated circuit in the innermost space adjacent to the innermost lead, wherein the inner non-horizontal side is planar and facing the integrated circuit;

a sealing filler in a sealing space directly and only between the innermost lead and the integrated circuit, the sealing filler having a filler bottom side coplanar with a die bottom side of the integrated circuit with the innermost lead between the sealing filler and the middle lead;

an electrical interconnect connected to the integrated circuit and the middle lead; and a package encapsulation over the integrated circuit, the innermost lead, and the middle lead, the package encapsulation partially in the sealing space and directly on the sealing filler in the sealing space and the electrical interconnect.

6. The system as claimed in claim 5 wherein the package encapsulation includes the package encapsulation partially exposing the integrated circuit and the sealing filler.

7. The system as claimed in claim 5 wherein the lead array includes a lead bottom side of the lead array coplanar with a die bottom side of the integrated circuit and a filler bottom side of the sealing filler with the lead bottom side, the die bottom side, and the filler bottom side exposed.

* * * * *

UNITED STATES PATENT AND TRADEMARK OFFICE
CERTIFICATE OF CORRECTION

PATENT NO. : 8,957,509 B2  
APPLICATION NO. : 13/166809  
DATED : February 17, 2015  
INVENTOR(S) : Do et al.

Page 1 of 1

It is certified that error appears in the above-identified patent and that said Letters Patent is hereby corrected as shown below:

In the Specification:

Column 7, line 63, delete "example. the" and insert therefor --example, the--

Column 7, line 64, delete "of an" and insert therefor --of the--

Column 7, line 67, delete "capsulation" and insert therefor --encapsulation--

Signed and Sealed this
Twenty-ninth Day of March, 2016

Michelle K. Lee
*Director of the United States Patent and Trademark Office*